(12) United States Patent
Strydom

(10) Patent No.: US 11,435,770 B2
(45) Date of Patent: Sep. 6, 2022

(54) FIXED CURRENT-GAIN BOOSTER FOR CAPACITIVE GATE POWER DEVICE WITH INPUT VOLTAGE CONTROL

(71) Applicant: TEXAS INSTRUMENTS INCORPORATED, Dallas, TX (US)

(72) Inventor: Johan Tjeerd Strydom, Saratoga, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/138,536

(22) Filed: Dec. 30, 2020

(65) Prior Publication Data

US 2021/0208617 A1    Jul. 8, 2021

Related U.S. Application Data

(60) Provisional application No. 63/031,258, filed on May 28, 2020.

(51) Int. Cl.
*G05F 1/575* (2006.01)
*G05F 1/577* (2006.01)
*G05F 1/565* (2006.01)

(52) U.S. Cl.
CPC .............. *G05F 1/577* (2013.01); *G05F 1/565* (2013.01); *G05F 1/575* (2013.01)

(58) Field of Classification Search
CPC .......... G05F 1/577; G05F 1/575; G05F 1/565; G05F 1/585; G05F 1/59; H03K 19/01; H03K 19/018521
See application file for complete search history.

(56) References Cited

U.S. PATENT DOCUMENTS

2016/0306371 A1* 10/2016 Svorc .................. H02M 3/1588

* cited by examiner

*Primary Examiner* — Jung Kim
(74) *Attorney, Agent, or Firm* — Michael A. Davis, Jr.; Charles A. Brill; Frank D. Cimino

(57) ABSTRACT

A current booster circuit, which can be coupled between a gate driver and a power switch, includes controlled current sources and current sensors to provide a scaled copy of the booster input current at the booster output while operating in a current-gain mode during on-to-off or off-to-on switching periods. During switched-on or switched-off periods, the booster can pull the output to the high or low rail, respectively, through low-impedance circuitry to hold the switch on or off. A voltage and/or current feedback path between the booster output and the booster input permits the booster to control the voltage input during switching operation. The current booster devices and methods can be compatible with both smart and conventional gate drivers of either the voltage-driven or current-driven variety.

11 Claims, 12 Drawing Sheets

FIXED CURRENT-GAIN BOOSTER FOR CAPACITIVE GATE POWER DEVICE WITH INPUT VOLTAGE CONTROL

CROSS-REFERENCE TO RELATED APPLICATION

This application claims priority to U.S. provisional patent application No. 63/031,258, filed May 28, 2020, which is hereby incorporated by reference.

TECHNICAL FIELD

This description relates generally to power electronic circuits, and more particularly to a fixed current-gain booster for a capacitive gate power device with an input voltage control.

BACKGROUND

A power transistor, such as a metal-oxide-semiconductor field effect transistor (MOSFET), insulated-gate bipolar transistor (IGBT), gallium nitride field effect transistor (GaNFET), silicon carbide (SiC) MOSFET, or high-electron-mobility transistor (HEMT), can be used as a power switch in devices such as motors and power converters. The gate electrode of a power transistor forms a capacitor that is charged or discharged each time the transistor is switched on or off. This gate capacitor may therefore need to be charged to at least a threshold gate voltage for the transistor to be switched on. Similarly, the gate capacitor may need to be discharged for the transistor to be switched off. When a transistor is commanded to be switched on or off with a change in voltage at its gate, it thus does not immediately switch from a non-conducting to a conducting state, but instead may transiently support both a gate-source voltage and conduct a drain-source current. When a gate current is applied to a transistor to cause it to switch, electrical power lost to heat can, in some cases, be enough to destroy the transistor or associated circuitry. The switching time of a transistor (e.g., on the order of microseconds) is inversely proportional to the amount of current used to charge the gate. To keep the switching time as short as possible, so as to reduce switching loss to heat, switching currents in the range of several hundred milliamperes or amperes may be used.

A switching signal for a power transistor can be generated by a controller integrated circuit (IC), such as a logic circuit or a microcontroller. The switching signal may, however, be limited to only a few milliamperes of current. A power transistor driven directly by such a low-current signal could switch very slowly, with high power loss.

To address issues of low switching signal current provision and high current drive requirement, a gate driver circuit (also called a "gate drive") can be provided as an interface between the low-current, logic-level control signals provided by the controller IC and the power transistor to be driven with high currents at its gate. A gate driver can serve as a power amplifier, accepting a low-power logic input from a controller IC and producing a low-impedance source output to the gate of a power transistor configured as a power switch. The switching current supplied by a conventional gate driver can be determined through the placement of a mainly resistor-based passive network between the gate driver and the gate of the power transistor.

Gate drivers can be provided either on a same chip as a controller IC and/or a power transistor, or as a discrete circuit. In contrast to conventional gate drivers, "smart" gate drivers incorporate into the gate driver features such as power transistor slew rate adjustment, switching loss optimization, electromagnetic interference performance optimization, automatic generation of a closed-loop deadtime, and power transistor and motor system protection features.

SUMMARY

An example circuit includes first and second input supply terminals and first and second output supply terminals. The circuit further includes a negative input current sensor having first and second negative input current sensing inputs and a negative input current measurement output, the first negative input current sensing input coupled to the first input supply terminal, the second negative input current sensing input configured to receive a negative input current. The circuit further includes a positive input current sensor having first and second positive input current sensing inputs and a measurement output, the first positive input current sensing input configured to receive a positive input current, the second positive input current sensing input coupled to the second input supply terminal. The circuit further includes a pull-up controlled current source having a pull-up input and first and second pull-up outputs, the first pull-up output coupled to the first output supply terminal, the second pull-up output configured to provide a positive output current, the pull-up input coupled to the positive input current measurement output. The pull-up controlled current source can be configured to provide the positive output current as a gain-scaled copy of the positive input current as measured by the positive input current sensor. The circuit further includes a pull-down controlled current source having a pull-down input and first and second pull-down outputs, the first pull-down output configured to provide a negative output current, the second pull-down output coupled to the second output supply terminal, the pull-down input coupled to the negative input current measurement output. The pull-down controlled current source can be configured to provide the negative output current as a gain-scaled copy of the negative input current as measured by the negative input current sensor. The circuit further includes output voltage sensing and control circuitry having a voltage-sensing input and a voltage-control output, the voltage-sensing input coupled to the second pull-up output, and the voltage-control output coupled to the second negative input current sensing input.

In an example method, an input voltage of a current booster circuit is determined to be less than an input voltage threshold. A positive input current into the current booster circuit is determined to be greater than a positive input current threshold. An output current source in the current booster circuit is enabled to produce a scaled copy of the positive input current as a positive output current of the current booster circuit. The input voltage is controlled to a first constant value or according to a first time-variant voltage profile. Then, responsive to determining either that an output voltage of the current booster circuit is greater than a first output threshold voltage or that the positive output current of the current booster circuit is less than a positive output current threshold, output pull-up circuitry can be enabled to pull and hold the output voltage to the value of a positive output rail of the current booster circuit, and the input voltage can be controlled to a value of a positive input rail of the current booster circuit.

Another example includes a circuit that includes first and second input supply terminals and first and second output supply terminals. The circuit further includes a pull-up transistor having a pull-up gate, a pull-up source, and a pull-up drain. The pull-up drain is configured to provide a positive output current. The circuit further includes a pull-down transistor having a pull-down gate, a pull-down source, and a pull-down drain. The pull-down drain is configured to provide a negative output current. The circuit further includes a negative input current sensor having first and second negative input current sensing inputs and a negative input current measurement output. The first negative input current sensing input is coupled to the first input supply terminal. The second negative input current sensing input is configured to receive a negative input current. The circuit further includes a positive input current sensor having first and second positive input current sensing inputs and a positive input current measurement output. The first positive input current sensing input is configured to receive a positive input current. The second positive input current sensing input is coupled to the second input supply terminal. The circuit further includes a positive output current sensor having first and second positive output current sensing inputs and a positive output current measurement output. The first positive output current sensing input is coupled to the first output supply terminal. The second positive output current sensing input is coupled to the pull-up source. The circuit further includes a negative output current sensor having first and second negative output current sensing inputs and a negative output current measurement output. The first negative output current sensing input is coupled to the pull-down source. The second negative output current sensing input is coupled to the second output supply terminal. The circuit further includes a first amplifying circuit having a first amplifying input and a first amplifying output. The first amplifying input is coupled to the negative input current measurement output. The first amplifying circuit can be configured to scale the negative input current measured by the negative input current sensor by a gain value. The circuit further includes a sink control operational amplifier having first and second sink control differential inputs and a sink control output. The first sink control differential input is coupled to the first amplifying output. The second sink control differential input is coupled to the negative output current measurement output. The sink control output is coupled to the pull-down gate. The circuit further includes a second amplifying circuit having a second amplifying input and a second amplifying output. The second amplifying input is coupled to the positive input current measurement output. The second amplifying circuit can be configured to scale the positive input current measured by the positive input current sensor by the gain value. The circuit further includes a source control operational amplifier having first and second source control differential inputs and a source control output. The first source control differential input is coupled to the positive output current measurement output. The second source control differential input is coupled to the second amplifying output. The source control output is coupled to the pull-up gate. The circuit further includes a low-pass filter or de-glitch filter having an input and an output, the input coupled to the pull-up drain and to the pull-down drain. The circuit further includes a high/low detector having an input and an output, the input coupled to the output of the low-pass filter or de-glitch filter. The circuit further includes input/output voltage control logic having an input and an output, the input coupled to the output of the high/low detector, the output coupled to the second negative input current sensing input and to the first positive input current sensing input.

DETAILED DESCRIPTION

To increase the drive capability of a gate driver configured to drive a gate terminal of a power transistor used as a power switch, a booster circuit can be provided as an intermediate component coupled between a gate driver and a power switch. A booster can be provided, for example, as an add-on circuit (e.g., in its own IC) to extend the capability of a gate driver, such as to provide higher power or additional feature sets. A booster circuit can be implemented as a low-impedance buffer with an external resistor, and can be configured as a voltage-source gate drive. Such a booster circuit may not be compatible with a smart driver, such as a time- and/or amplitude-varying current-source gate driver, because information to be transferred from power switch to gate driver or vice-versa can be lost through the booster. The example devices and methods described herein provide a fixed current-gain booster for a capacitive gate power device with input voltage control. An example fixed current-gain booster with input voltage control includes controlled current sources and current sensors configured to provide a scaled copy of the booster input current at the booster output while operating in a current-gain mode during on-to-off or off-toon switching periods. The fixed current-gain booster with input voltage control further provides feedback control circuitry configured to control an input voltage of the booster to a specified constant voltage value or according to a time-variant voltage profile. The fixed current-gain booster with input voltage control devices and methods described herein can be compatible with both smart and conventional gate drivers of either the voltage-driven or current-driven variety.

Figure 1:
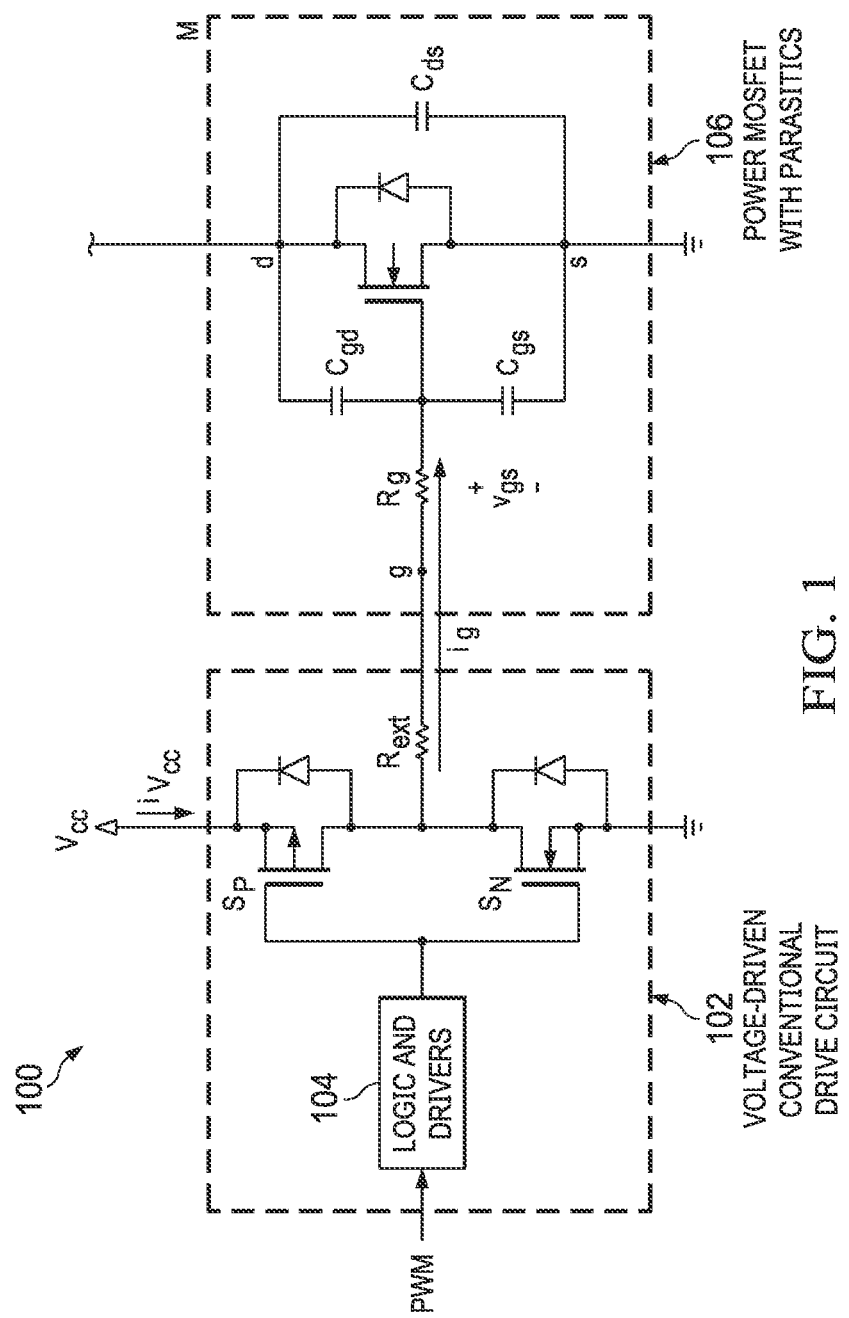
FIG. 1 is a block diagram of an example power switching configuration having a conventional voltage-driven gate drive circuit coupled to a power switch.
Figure 2:
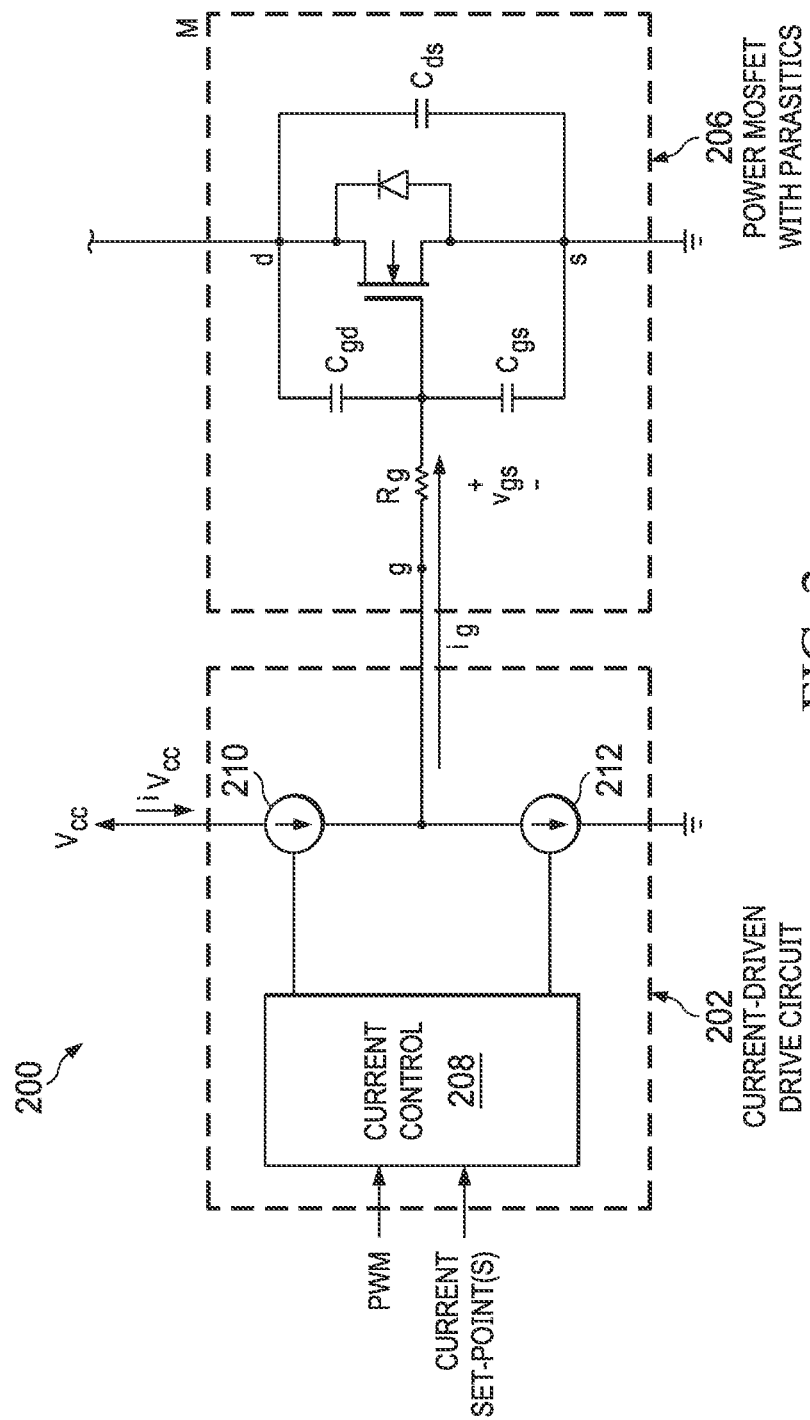
FIG. 2 is a block diagram of an example power switching configuration having a current-driven gate drive circuit coupled to a power switch.

FIGS. 1 and 2 are block diagrams of example power switching configurations 100, 200 each having a conventional gate drive circuit 100 or simple constant-current gate drive circuit 200 coupled to a gate terminal g of a power switch. Gate driver 102 in FIG. 1 is a voltage-driven gate driver, and gate driver 202 in FIG. 2 is a current-driven gate driver.

In FIG. 1, switch 106 is illustrated as a MOSFET having parasitic gate-drain capacitance $C_{gd}$, gate-source capacitance $C_{gs}$, drain-source capacitance $C_{ds}$, and internal gate resistance $R_g$. Switch 106 may also have parasitic inductances (not shown). The non-idealities of switch 106 represented by these parasitic parameters signify that there is a practical limit to how fast the illustrated power transistor can be switched. A drain terminal d of the switch 106 can be coupled to circuitry that uses power regulated by switch 106, and ultimately, through such circuitry, to a positive supply rail. A source terminal s of the switch 106 can be coupled to a circuit ground or to any practical potential in the power conversion circuit. The power transistor of switch 106 can also be otherwise located in a power conversion circuit, and what is pictured as a ground terminal in FIG. 1 is not required to be a circuit ground in example implementations. Voltage-driven gate driver 102 can be provided with a logic-level pulse width modulation (PWM) digital logic signal as its control input and can provide a control current $i_g$ to drive the gate g of the switch 106.

Voltage-driven gate driver 102 includes logic and pre-driver circuitry 104 and switching devices $S_P$, $S_N$ that are configured to pull the gate of the power transistor in switch 106 either low or high, according to the input logic signal (labeled PWM) and following Ohm's law. During switching, the gate-source voltage of the power transistor $V_{GS}$ transitions between the voltage values of the supply rails to which the power transistor is coupled. The voltage difference between the circuit ground and the gate driver's positive supply rail $V_{CC}$, along with the gate driver resistance $R_{ext}$ and the parasitic gate resistance of the power transistor $R_g$, determine the maximum of the gate current $i_g$ current flowing into or out of the gate terminal g. As the gate of the power switch 106 charges or discharges, the gate current $i_g$ changes according to the remaining gate voltage $V_{GS}$.

Whatever type of field effect transistor is used as the power transistor in switch 106, its switching behavior is determined by an electric field, meaning that its gate input has capacitance. Current $i_g$ charges or discharges this gate capacitance. After the capacitance is charged, the power transistor remains in an "on" state, as the voltage across that capacitor generates sufficient electric field to keep the device on. Such switching is not instantaneous. Current $i_g$ has a time profile, and this profile has an energy loss associated with it. The value of gate driver resistance $R_{ext}$ can be chosen as a design parameter to determine the switching speed of the switch 106. Gate driver resistance $R_{ext}$ can be chosen to be as small as practicable to increase switching speed as much as possible, in view of the power losses associated with longer switching times. A gate driver resistance $R_{ext}$ chosen to be too small, however, may result in undesirable levels of electromagnetic interference (EMI) or in "shoot-through," a kind of failure event that results, for example, when two adjacent switches in a voltage source inverter are on simultaneously, short-circuiting the supply. Irrespective of the choice of gate driver resistance $R_{ext}$, parasitics within the switch 106 limit its switching speed.

Additionally, as gate-source voltage $V_{GS}$ increases, the gate current $i_g$ is reduced, according to an RC time constant associated with the switch 106. Gate current $i_g$ initially spikes high, but then drops with time, according to a current profile. The gate-source voltage $V_{GS}$ needed to switch the power switch 106 on is not positive supply rail voltage $V_{CC}$, but rather is crossed during a voltage transition according to the current profile, the precise switching point being the Miller plateau voltage of the power transistor and varying with the drain current $i_d$. For transistor devices such as silicon carbide transistors having a low maximum transconductance $g_m$ and a widely varying plateau voltage, the gate current $i_g$ flowing into the power transistor will likewise vary during the switching transition (during the plateau voltage). Therefore, at high current, the switch 106 switches more slowly, and at low current, the switch 106 switches faster, which is the opposite of the desired behavior, and can be addressed with the use of a constant-current drive.

FIG. 2 illustrates a block diagram of an example power switching configuration 200 having a smart current-driven gate drive circuit 202 coupled to a gate terminal g of a power switch 206, which, as illustrated, is identical to switch 106 of FIG. 1. As compared to voltage-drive gate driver 102, current-driven gate driver 202 has the resistance $R_{ext}$ removed as unnecessary and the switching devices $S_P$, $S_N$ replaced with current sources 210, 212, which are controlled by current control circuitry 208, which is provided with a low-current PWM digital logic signal as its control input. An additional input provides one or more current set-points to current control circuitry 208. When current-driven gate driver 202 drives within the limitations of the circuit, gate current $i_g$ is constant. The speed at which the power switch 206 turns on or off is repeatable and is independent of the plateau voltage. The ability of current-driven gate driver 202 to generate a constant gate current $i_g$ permits the current to be made time-variant in that it can be set to different, substantially constant current values during different time intervals of the switching process of the power switch 206. By controlling the value of the current provided by current sources 210, 212, the speed at which the power switch 206 switches can be adjusted. Whatever the particulars of its implementation, current drive as in FIG. 2 thus enables a control space for different driving profiles of power switch 206.

Figure 3:
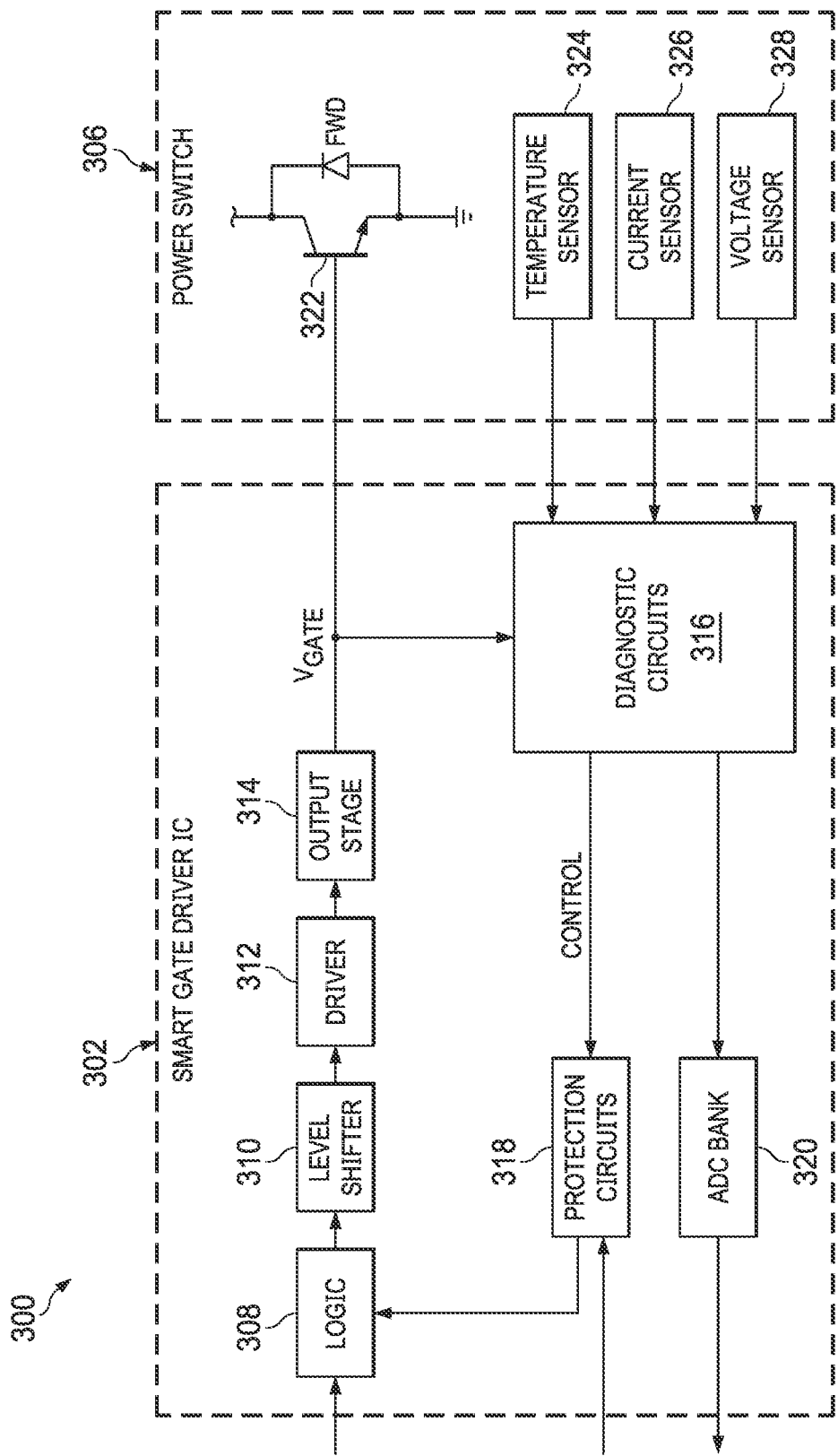
FIG. 3 is a block diagram of an example smart driver power switching arrangement having a smart current-driven gate drive circuit coupled to a gate terminal of a power switch.

FIG. 3 illustrates a block diagram of an example smart driver power switching arrangement 300 having a smart current-driven gate drive circuit 302 coupled to a gate terminal of a power switch 306, which includes transistor 322 and can also include various sensors 324, 326, 328 for providing operational feedback to the smart driver 302. Responsive to the provided operational feedback, smart driver 302 can monitor and adjust current provided to the gate of the transistor 322. As examples, current sensor 326 can be arranged to measure the drain current or the source current through transistor 322, and/or voltage sensor 328 can be arranged to measure the drain-source voltage across transistor 322 or to measure the switch-node voltage. Drive strength can be varied during operation, either cycle-by-cycle, time-variant (in real time), clocked, sectioned, or a combination of these. Gate current can be adjusted using control that is open-loop, closed-loop, or adaptive. In closed-loop control, feedback (e.g., from sensors 324, 326, 328 or from diagnostic circuits 316) is processed in real time to make instantaneous adjustments to the gate current. By contrast, in adaptive control, the result of a particular gate current output value is measured and processed to provide result information that is utilized in adjusting the commanded gate current during a subsequent switching of power switch 306. Adaptive control can be provided at the expense of higher computational power or bandwidth as compared to closed-loop control.

For providing gate current to switch 306 and providing other features and digital diagnostic outputs, smart driver 302 can include input logic 308, level shifter 310, driver 312, output stage 314, protection circuits 318, and a bank of analog-to-digital converters (ADCs) 320. In contrast to conventional voltage-driven driver 102, in which performance is controlled by adjusting external resistor $R_{ext}$, or current-driven gate driver 202, in which performance is controlled by adjusting a current set-point without the need for an external resistor $R_{ext}$, smart driver 302 permits dynamic control of the set-point time variant in real time, or adaptively.

In some cases, the gate driver may not be strong enough, e.g., may not be capable of driving enough gate current $i_g$, to drive the power switch. Also, because of thermal limitations of the gate driver component, it may be preferable to replace the function of the gate driver on its output side with a buffer circuit herein referred to as a booster. A booster can be driven with a current $i_B$ provided by a gate driver, and the booster can, in turn, supply a gate current $i_g$ to a power transistor used as a power switch coupled to the output of the booster. The booster has a high current gain, and functions as a voltage buffer, with the booster's output current $i_g$ being a function of a voltage drop across a selectable or adjustable booster output resistance $R_G$ coupled between the booster and the power switch gate. Booster output resistance $R_G$ can be chosen to provide a specified output current $i_g$, just as voltage-driven conventional gate driver resistance $R_{ext}$ in FIG. 1 could be chosen to provide a specified gate current. The value of booster output resistance $R_G$ is independent of driver-to-booster resistance $R_B$ and of the buffer. The booster supplies the current $i_g$ that flows through resistance $R_G$, and the gate driver no longer plays a role in determining the transient current event 302 described with respect to the driver-switch arrangement of FIG. 2. In arrangements having a booster, the gate driver need only generate enough base drive current $i_B$ to drive the booster.

Figure 4:
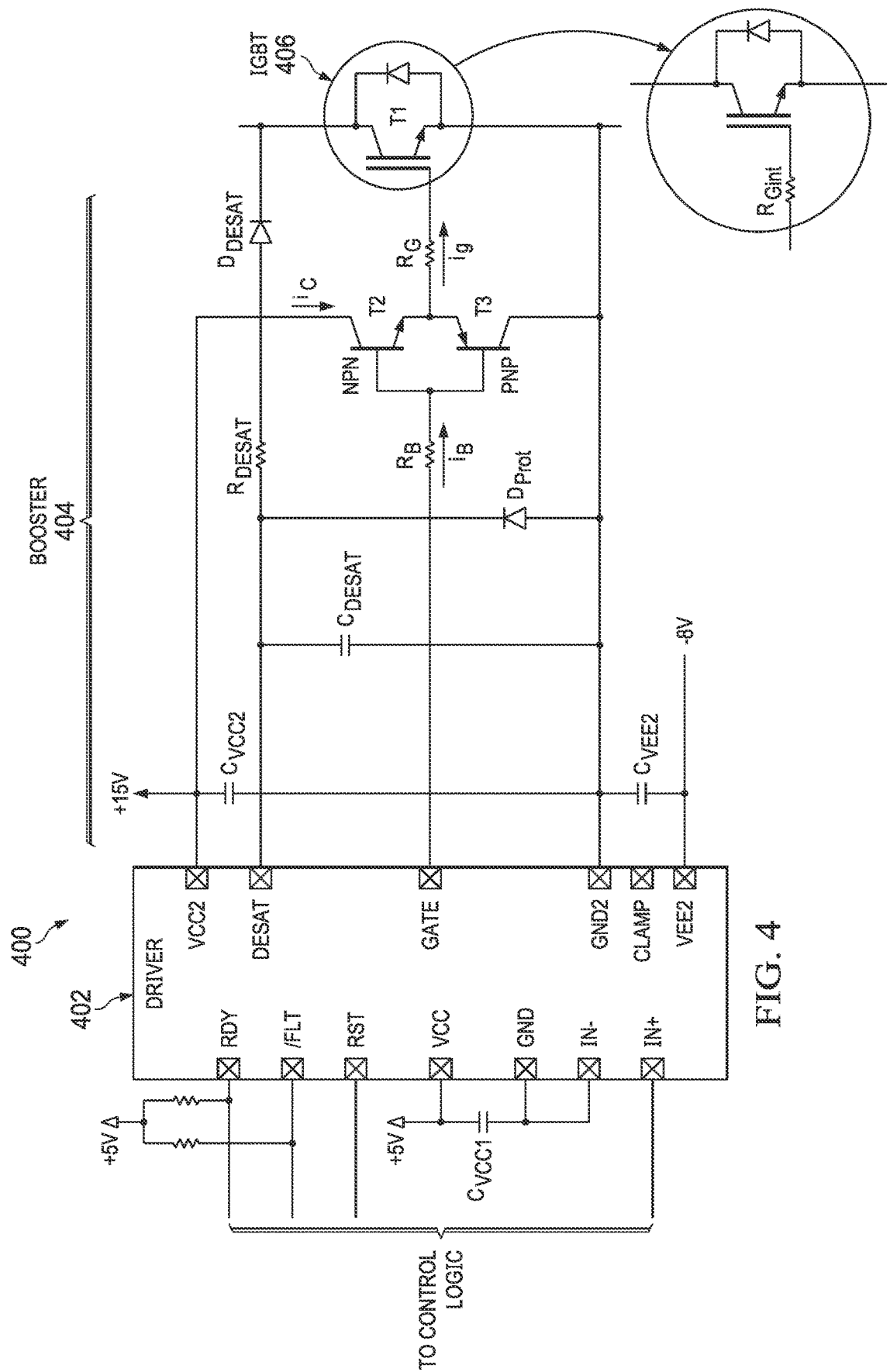
FIG. 4 is a block diagram of an example arrangement having an NPN/PNP booster circuit between a gate driver and a power switch.

FIG. 4 shows an example arrangement 400 including a gate driver 402, a booster circuit 404, and a power switch implemented as a large IGBT module T1. As compared to arrangements 100, 200, and 300, in arrangement 402, a discrete complimentary output stage of NPN/PNP bipolar junction transistors (BJTs) T2, T3 is added to the output of a driver IC 402 to serve as booster 404. The NPN and PNP booster transistors T2, T3 can be fast-switching transistors and can have sufficient current gain to deliver the desired peak output current. NPN transistor T2 turns on the power transistor T1, and PNP transistor T3 turns off the power transistor T1. During turn-on, output current $i_B$ from the driver 402 is provided to the base of the external NPN booster transistor T2, which pulls up the upstream end of resistor $R_G$ to VCC2, the highest voltage in arrangement 400. When the power switch gate voltage is zero, the full supply voltage appears across resistor $R_G$, so the current $i_g$ through resistor $R_G$ is equal to VCC2/$R_G$. NPN booster transistor T2 thus multiplies the base current $i_B$ by the DC current gain $h_{FE}$ of the NPN booster transistor T2, with the much higher current is at the collector. The output current from the driver IC 402 is reduced by the factor of the DC current gain $h_{FE}$ of the NPN booster transistor T2. Most of the power dissipation burden is thus placed on the NPN booster transistor T2, instead of on the driver IC 402. Gate resistor $R_G$ can be sized according to the power transistor and application requirements, and the base resistor $R_B$ can be sized to provide to limit the base current according to the gain of the booster transistors T2, T3.

Figure 5:
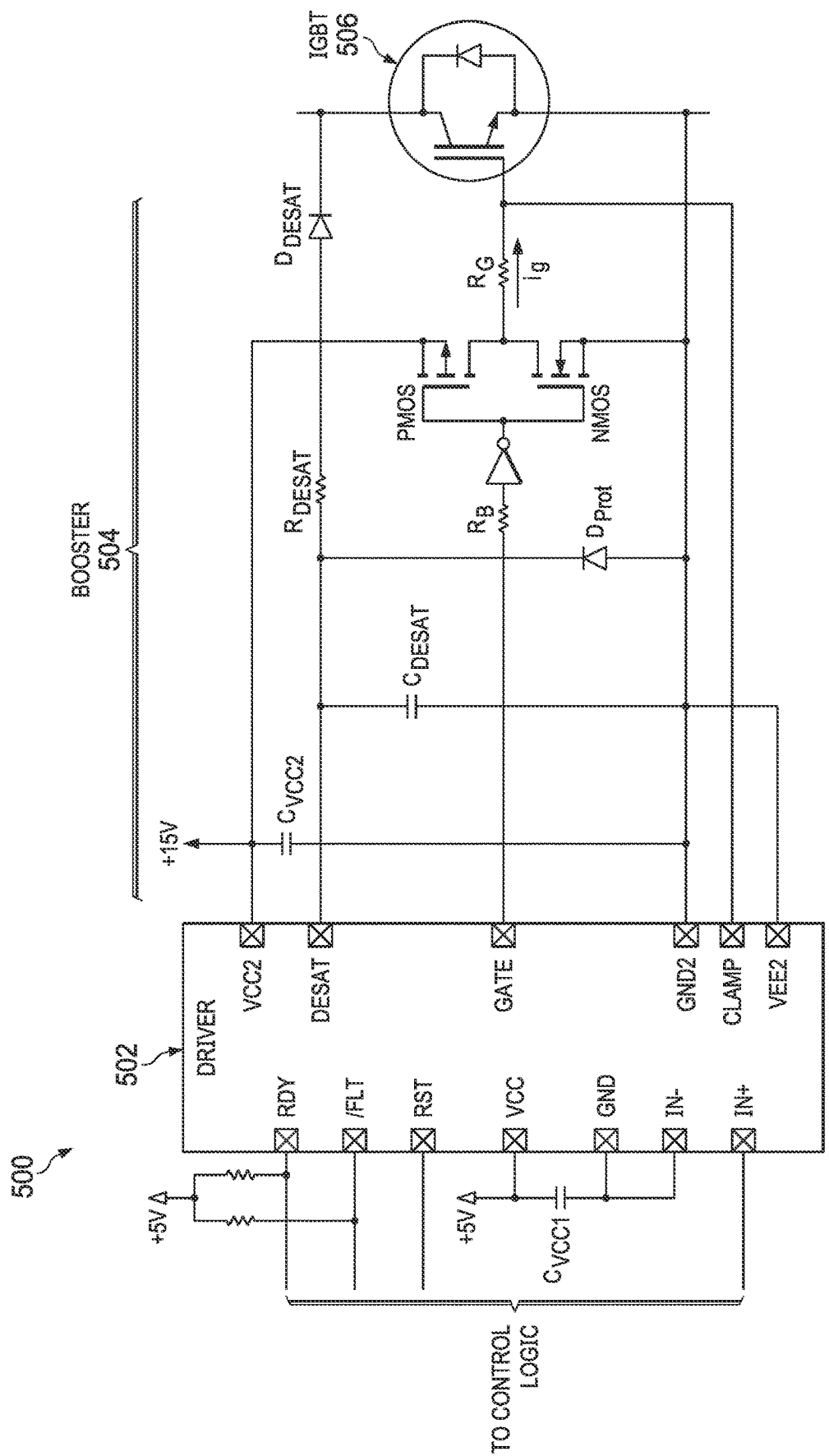
FIG. 5 is a block diagram of an example arrangement having a PMOS/NMOS booster circuit between a gate driver and a power switch.

FIG. 5 shows an example arrangement 500 including a gate driver 502, a booster circuit 504, and a power switch implemented as a large IGBT module T1. As compared to the arrangement 400 of FIG. 4, arrangement 500 has a unipolar supply for the driver IC 502, and instead of the booster 504 using BJTs, booster 504 is responsive to a pair of PMOS and NMOS MOSFETs, with an inverter to correct for polarity. The MOSFET-based booster 504 has the advantages of higher switching speed and almost rail-to-rail output as compared to the BJT-based booster 404 of FIG. 4, which may suffer voltage loss at output $V_{CE(sat)}$. As with BJT-based booster 404, in MOSFET-based booster 504, the booster 504 and creates driving current $i_g$ through resistance $R_g$. The driving current $i_g$ is determined by the voltage drop across resistance $R_g$. The voltage at the input and output of the booster is the same. Whereas in BJT-based booster 404, resistance $R_B$ can be sized to provide enough base current $i_B$, the choice of resistance $R_B$ does not affect the MOSFET-based booster 504 due to the inverter and field effect nature of the MOSFETs that does not require a continuous base drive.

With either arrangement 400 or 500, as the gate of power transistor 406 charges up during turn-on, the voltage drop across resistor $R_G$ diminishes, and after the voltage across the gate of power transistor 406 gets close to the rail VCC2, the current $i_g$ diminishes almost to zero, in accordance with an RC time constant. So as not to have a highly varying current $i_g$, a constant current driver can be used as current driver 402 or 502. Where a large gate resistor $R_G$ is used, then most thermal losses are incurred in the gate resistance $R_G$. Driver IC 402 or 502 may have limited capability to dissipate heat, due, for example, to driver design considerations implemented to perform electrical isolation between input and output pins of driver IC 402 or 502. Booster 404 or 504 separates out thermal losses away from the driver 402 or 502. In examples where booster 404 or 504 is spatially isolated from driver 402 or 502 and/or built into a larger package, for example, with a thermally conductive metal exposed area that can be soldered to a printed circuit board (PCB) to wick away heat, booster 404 or 504 can more effectively dissipate generated heat. A heat damage threat posed by booster 404 or 504 to driver IC 402 or 502 may thus be reduced.

Figure 6:
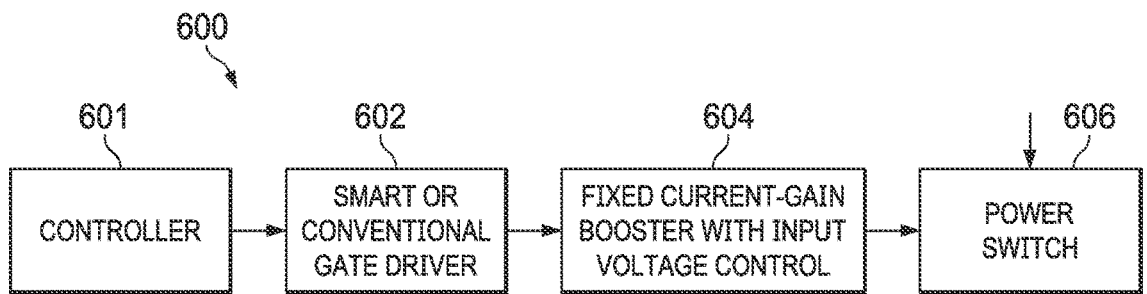
FIG. 6 is a high-level block diagram of an example arrangement having a fixed current-gain booster circuit with input voltage control between a smart or dumb gate driver and a power switch.

FIG. 6 is a high-level block diagram of a controller-driver-booster-switch arrangement 600 wherein booster 604 is a fixed current-gain booster with input voltage control, configured to provide a scale replica of its input current as an output so it is compatible with either a smart driver or a conventional driver implemented as gate driver 602. Controller 601 is configured to provide a low-current logic signal, e.g., a PWM signal, to control switching on or off of power switch 606, which can be implemented as a MOSFET, an IGBT, a GaNFET, a SiC MOSFET, an HEMT, or another suitable type of power field effect transistor. Gate driver 602, which in some examples can be implemented as its own IC or in some examples integrated with controller 601, can contain circuitry configured to translate the low-current digital signal from controller 601 into a higher-current drive signal. Booster 604 can be implemented as discrete components or as a separate IC from driver 602 and can be configured to provide thermal isolation from driver 602. The output of booster 604 is provided to a gate terminal of power switch 606. Although feedback lines are not explicitly shown in FIG. 6, power switch 606 can also include one or more sensors configured to provide feedback to booster 604 and/or driver 602.

Figure 7:
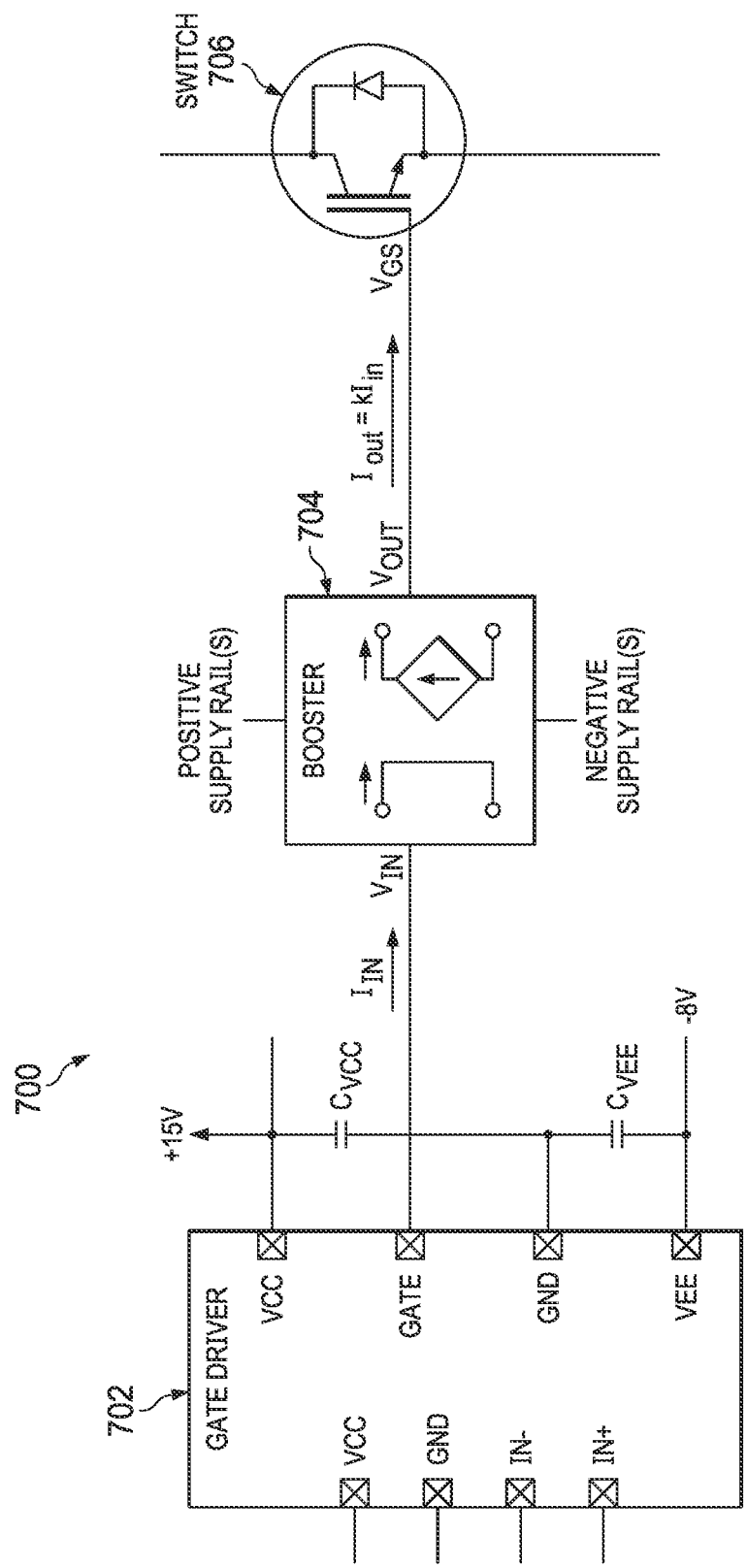
FIG. 7 is a block diagram of an example driver-booster-switch arrangement.

FIG. 7 is a block diagram of an example driver-booster-switch arrangement 700 wherein booster 704 is a fixed current-gain booster with input voltage control configured to provide a scale replica of its input current $I_{in}$ as an output current $I_{out}$ so it is compatible with either a smart driver or a conventional driver implemented as gate driver 702. Booster 704 of FIG. 7 can be used to implement booster 604 of FIG. 6. Booster 704 is a two-port network with input port configured to measure the current $I_{in}$ coming from the gate driver 704, and with internal circuitry to generate a proportional current $I_{out}$ coming out the output port. The output current follows the input current precisely, within tolerance, and with a specified current gain k. In practical implementations the current gain k of booster 704 can be between 1 and 500, e.g., between 1 and about 200, e.g., between 1 and about 100, e.g., between 1 and about 40, e.g., about 10. In some examples, current gain k can be about 100. Current gain k can be fixed, but in some examples, can be made selectable.

In some examples, booster 704 can have one common positive supply rail for both its input side and its output side and one common negative supply rail for both its input side and its output side. In other examples, booster 704 can have separate, independent input and output supply rails (both positive and negative). In still other examples, the input and output rails can be tied externally, but remain dynamically separate. In a fast, dynamic switching environment with significant ground bounce and relative ground movement, providing independent input and output rails can increase noise immunity.

Instead of being a logic buffer, booster 704 is configured such that the input current $I_{in}$ is in full control of the output current $I_{out}$. This is not the case with the transistor-pair buffer circuits used to implement boosters 404 and 504 in FIGS. 4 and 5, where the external gate resistor $R_G$ dictates the delivered gate current $i_g$. Gate driver 702 can be implemented as its own IC and can contain circuitry configured to translate a low-current digital signal from a controller (not shown in FIG. 7) into a higher-current drive signal. Booster 706 can be implemented as discrete components or as a separate IC from driver 702 and can be configured to provide thermal isolation from driver 702. The output of booster 704 is provided to a gate terminal of a power transistor 706 configured as a power switch.

Because booster 704 gains the input current $I_{in}$ as the output current $I_{out}$, and because booster 704 can control its input voltage, booster 704 is compatible not only with a conventional driver, where a resistor, such as resistor $R_{ext}$ in FIG. 1, is used on the gate driver side to determine the gate current, but booster 704 will also work with constant-current drives, such as driver 202 of FIG. 2, and with smart drivers that have time-variant gate-drive currents, such as driver 302 of FIG. 3. Even where the driver is smart and outputs a sequence of current steps, or another form of time-variant current, the output of booster 704 will follow that time-variant input current, gaining it by a fixed-gain ratio. Boosters 404 and 504 function as voltage buffers so the output current $i_g$ is determined by the booster itself, with no practical correlation between input current $i_B$ and output current $i_g$. In NPN/PNP booster 404, the input voltage is correlated to the output voltage, with the output voltage of the booster rising as the power transistor 406 charges, and thus also the input voltage of the booster 404. In PMOS/NMOS booster 504, the input voltage and output voltage of the booster are completely uncorrelated, because of the inverting buffer stage, which results in complete loss of information regarding the input to the power transistor 506 at the booster input. In view of this decoupling of input and output, booster 504 functions as a pure logic buffer. The input-output decoupling of boosters 404 and 504 makes them incompatible with smart drivers. By contrast, booster 704 generates output current $I_{out}$ as a scaled replica of input current $I_{in}$, without having the input voltage $V_{IN}$ track the output voltage $V_{OUT}$, but without the input voltage $V_{IN}$ being completely independent of the output voltage $V_{OUT}$, as it would be in the case of a pure logic buffer.

Figure 8:
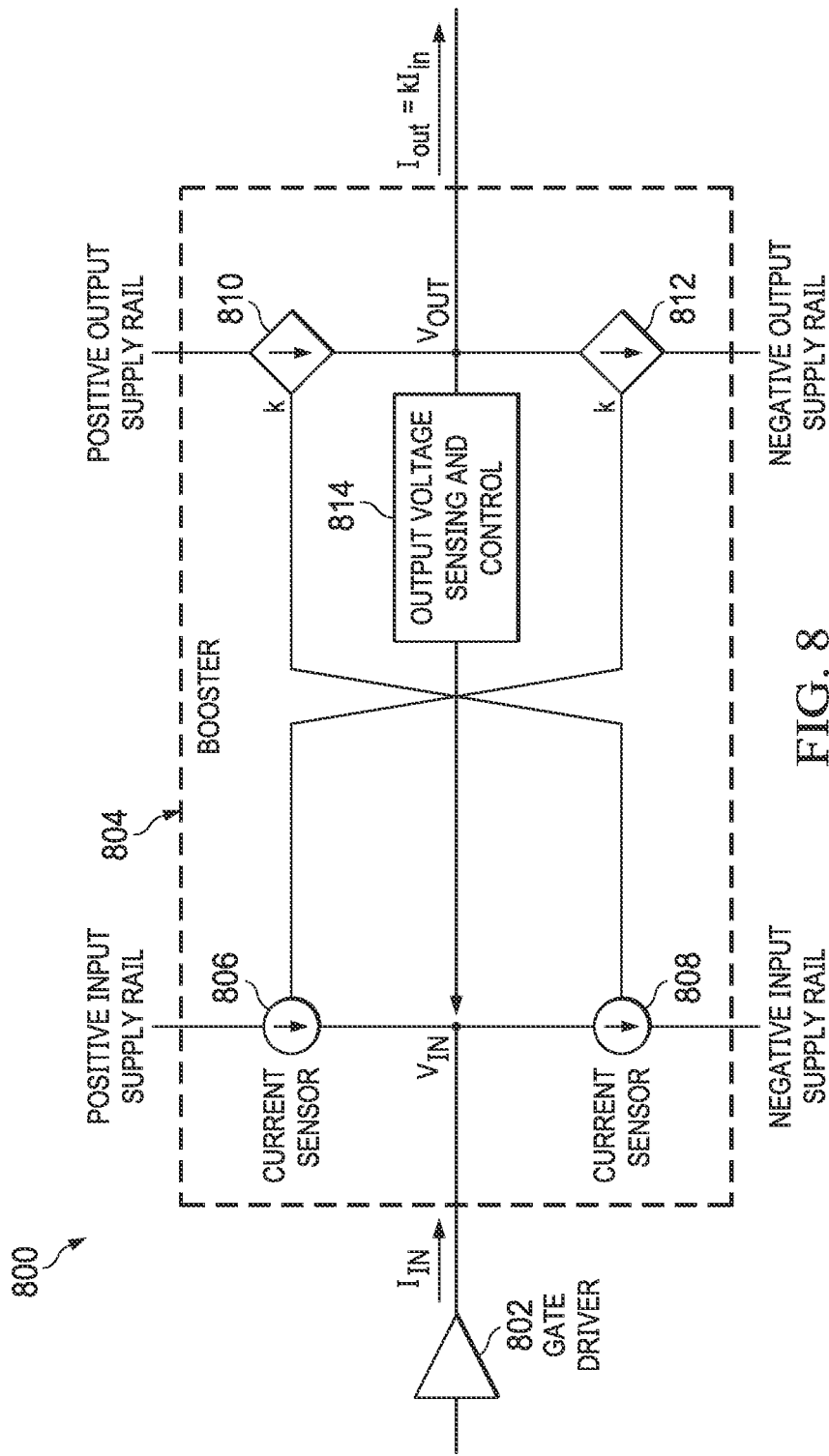
FIG. 8 is a block diagram of an example driver-booster arrangement.

FIG. 8 shows an example driver-booster arrangement 800 having gate driver 802 and an example fixed current-gain booster with input voltage control 704, which can be used to implement booster 704 of FIG. 7 or booster 604 of FIG. 6. Booster 804 can include, on the input side, input current sensing circuits 706, 708 that are configured to measure input current $I_{in}$, and, on the output side, an output current amplifier stage that can include output current sources 810, 812 that are configured to generate output current $I_{out}$ proportional to the input current $I_{in}$. Booster 804 can further include output voltage sensing and control circuitry 814 configured to relay information about the output voltage $V_{OUT}$ to the input. As an example, output voltage sensing and control circuitry 814 can be implemented as an RC low-pass filter and a comparator configured as a delay buffer to measure the output voltage $V_{OUT}$, filter it, and to change the input voltage $V_{IN}$ from an initial value (or intermediate value) to a final, maximum value only after the output voltage $V_{OUT}$ reaches a threshold difference from a rail voltage value and remains within the threshold difference for a certain amount of time. Current sensors 808, 806 on the input (left) side of FIG. 8 provide respective inputs to respective controlled current sources 810, 812 on the output (right) side, where the controlled current value is k times larger than the sensed current. As one example, current sensors 808, 806 can comprise resistors to measure a voltage drop across them. As one example, current sources 810, 812 include transistors, e.g., FETs, that are adjustable to control a level of output current.

Figure 9:
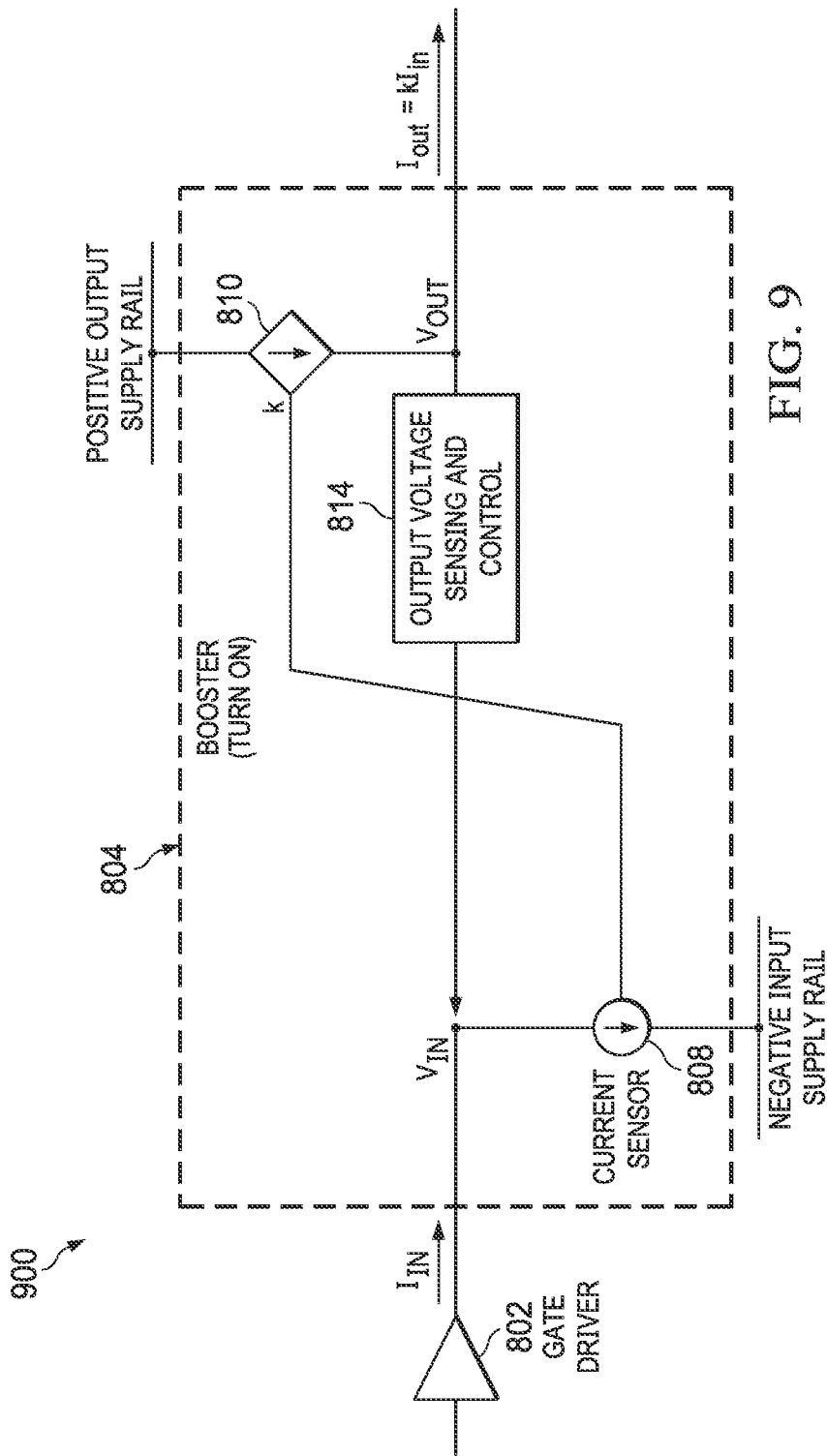
FIG. 9 is a block diagram of an example driver-booster arrangement illustrating the turn-on-involved elements of the booster of FIG. 8.
Figure 10:
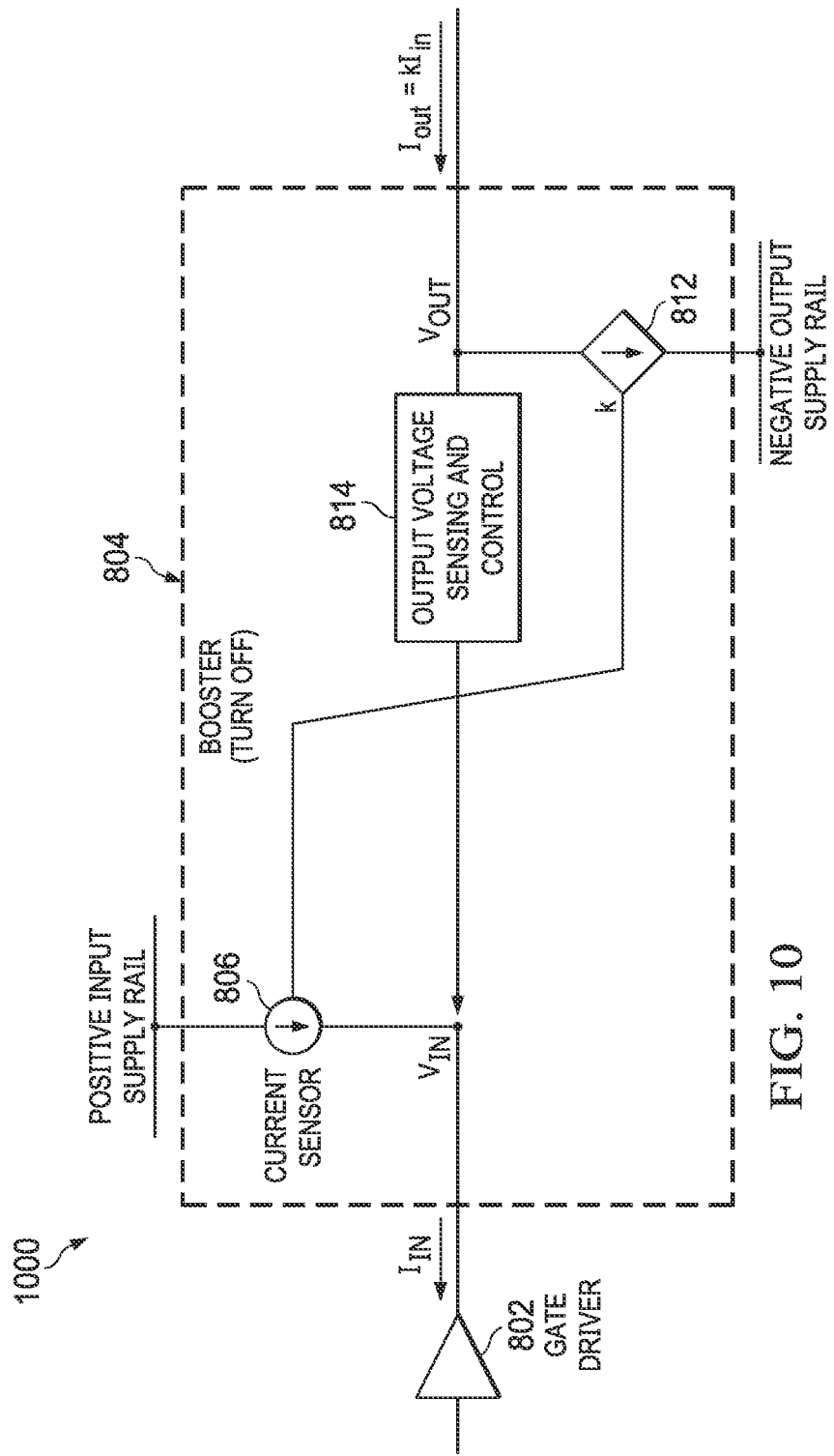
FIG. 10 is a block diagram of an example driver-booster arrangement illustrating the turn-off-involved elements of the booster of FIG. 8.

FIGS. 9 and 10 show example driver-booster arrangements 900, 1000 that illustrate, in a simplified manner, the functioning of booster 804 of FIG. 8 during respective power transistor turn-on and turn-off periods of operation. Depending on its direction, input current $I_{in}$ from gate driver 802 either flows in from gate driver 802, down through current sensor 808 toward the negative input supply rail (if positive, generally corresponding to switch turn-on, as shown in FIG. 9) or (if negative, generally corresponding to switch turn-off, as shown in FIG. 10) from the positive input supply rail down through current sensor 806 and out towards the gate driver 802. Booster 804 scales (by current gain factor k) and duplicates sensed input current $I_{in}$ as the output current $I_{out}$ using the illustrated cross-coupling to report the values of measured input currents from the input to the output. The value of measured current $I_{in}$ is reported by current sensor 808 to current source 810. The value of measured current $I_{in}$ is reported by current sensor 806 to current source 812. At either current source 810, 812, the input current $I_{in}$ is scaled by a constant factor k to produce the output current $I_{out}$. The value of the gate voltage of the power transistor to which booster 804 is coupled at its output, $V_{OUT}$, can be used to control a voltage $V_{IN}$ on the input using the output voltage sensing and control circuitry 814. Alternatively, the output current $I_{out}$ can be used to control the voltage $V_{IN}$ on the input. Among other functions, the voltage feedback provided by output voltage sensing and control circuitry 814 prevents the input voltage $V_{IN}$ from collapsing to the voltage value of a supply rail, which could cause $I_{in}$ to become zero and stop the booster 804 from producing output current $I_{out}$. Because the input voltage $V_{IN}$ directly follows the output voltage $V_{OUT}$, current flow, both internally and externally to the booster 804, is preserved by output voltage sensing and control circuitry 814.

Although the output of the booster 804 may be tied directly to the power transistor being switched, the ground of the gate driver 802 is not required to be, offering the possibility of decoupling between the booster input and the output grounds, which can provide a safety benefit. Additionally, although there may be a resistor (not shown in FIGS. 8-10, but see, e.g., $R_B$ in FIG. 4 or 5) between the gate driver 802 and the booster 804 in examples in which a conventional driver is used, a resistor between the booster and the power transistor (see, e.g., $R_G$ in FIG. 4 or 5) is not required. In a voltage-buffer booster like booster 404 or booster 504, gate resistor $R_G$ sets the amount of gate current $i_g$ provided to the gate of the power transistor. The use of booster 804 eliminates a requirement for gate resistor $R_G$.

Output voltage sensing and control circuitry 814 can be configured to precisely control the shape of the time profile of booster input voltage $V_{IN}$. In one example, during turn-on of the power transistor, input voltage $V_{IN}$ can be controlled to remain at its initial low value (e.g., the voltage value of the negative input supply rail) until the power transistor has completely switched on, at which point input voltage $V_{IN}$ can be driven to a maximum value (e.g., the voltage value of the positive input supply rail) to cut off input current $I_{in}$ supplied from the gate driver 802. Following turn-on, input current $I_{in}$ supplied from the gate driver 802 is unnecessary to the maintenance of the on state of the power switch, and is dissipative of power.

In another example, during turn-on of the power transistor, input voltage $V_{IN}$ can increased to an intermediate value at the beginning of the turn-on operation, the intermediate value being greater than the initial low value and less than the maximum value. Input voltage $V_{IN}$ can be set to remain at this intermediate value until the power transistor has completely switched on, at which point input voltage $V_{IN}$ can be driven to a maximum value to cut off input current $I_{in}$ supplied from the gate driver 802. Setting input voltage $V_{IN}$ to an intermediate voltage that is higher than its starting voltage but not as high as its maximum voltage provides headroom between the booster input and output to better accommodate the transient ringing that can be observed during switching as a result of parasitic inductances, and thus preventing input voltage $V_{IN}$ from hitting a supply rail. In some examples, the intermediate value can be halfway between the initial value and maximum value, while in other examples, the intermediate value can be set to a value that provides increased headroom as compared to a halfway intermediate value.

In still other examples, during turn-on of the power transistor, output voltage sensing and control circuitry 814 can variably control the booster input voltage $V_{IN}$ in accordance with a time-profile shape that further reduces the possibility of transient ringing causing the input voltage to rise or fall to the same voltage value as the positive input rail or the negative input rail. If the time and shape of the ringing can be determined or predicted, the booster input voltage $V_{IN}$ can be set to high during a low swing of the transient ringing, and can be set to be low during a high swing of the transient ringing, dynamically increasing the headroom.

Figure 11:
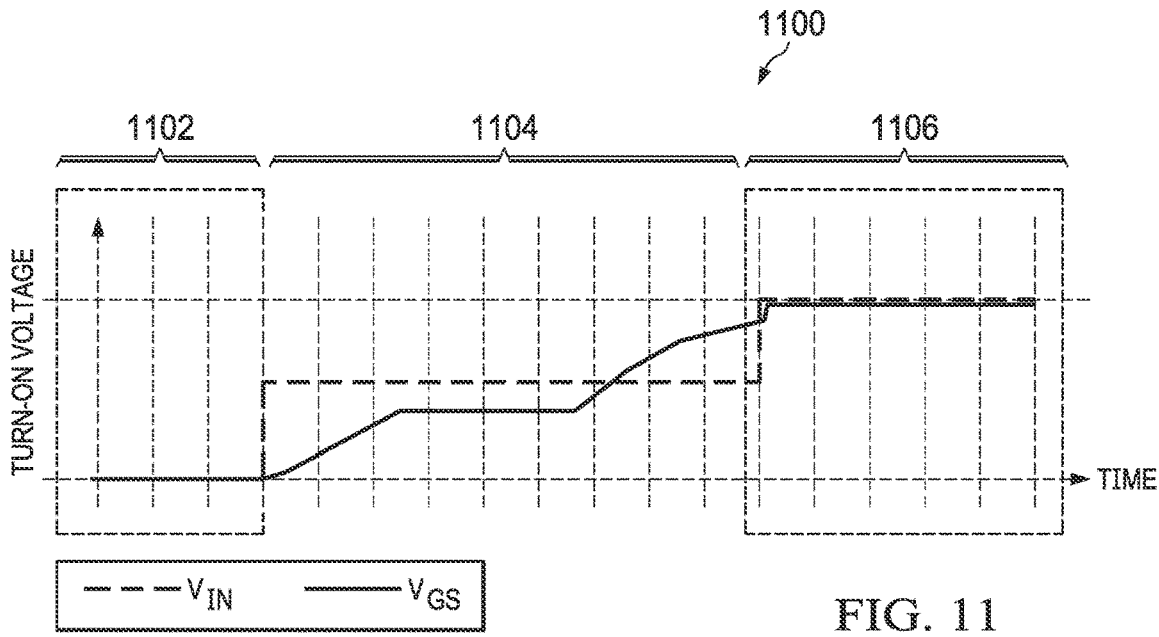
FIG. 11 is a timing diagram showing example levels of booster input and output voltage during an off-to-on switching transition.
Figure 12:
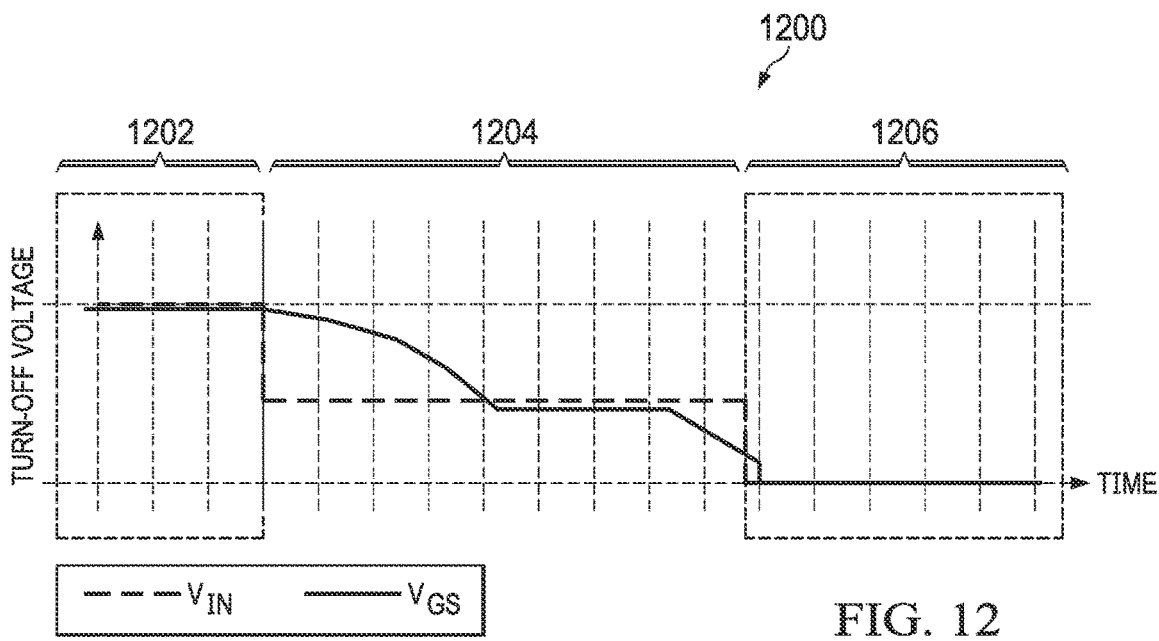
FIG. 12 is a timing diagram showing example levels of booster input and output voltage during an on-to-off switching transition.

The timing diagrams of FIGS. 11 and 12 illustrate levels of booster input voltage $V_{IN}$ and power transistor gate-source voltage $V_{GS}$, which is also the booster output voltage, during respective off-to-on and on-to-off switching transitions. The turn-on timing diagram of FIG. 11 is divided into three periods, a first period 1102 in which the switch is off, a second period 1104 in which the switch is transitioning from off to on, and a third period 1106 in which the switch is completely on. The initial condition at the beginning of the first period 1102 is that the booster output voltage $V_{GS}$ is low and the booster input voltage $V_{IN}$ is also low. At the start of the transition period 1104, the booster may detect, e.g., using current sensor 808, a positive input current from a gate driver to which the booster is coupled.

As the gate capacitance of the power transistor charges and the gate-source voltage $V_{GS}$ rises, as may be detected, for example, by output voltage sensing and control circuitry 814, the booster can control the input voltage $V_{IN}$ to a controlled value, also using output voltage sensing and control circuitry 814. In the example of FIG. 11, the controlled value is shown as an intermediate voltage value, between off and on voltage values, that places input voltage $V_{IN}$ at half-rail. This controlled value is kept constant throughout the transition period 1104. Maintaining a constant booster input voltage $V_{IN}$ during switching can, in some applications, have benefits associated with a constant input current $I_{in}$ coming from the gate driver into the booster. If the booster input voltage $V_{IN}$ is kept constant during switching, a conventional driver coupled to the input of the booster via an external resistor will have a fixed voltage drop across the external resistor, which can be expected to have a very low or zero temperature coefficient. By keeping the input voltage $V_{IN}$ constant, the current $I_{in}$ provided by the conventional gate driver through the external resistor is likewise held constant and independent of temperature. The ability of booster 804 to clamp the input voltage $V_{IN}$ at a fixed value makes a voltage-driven conventional driver, having what otherwise would be a highly variable driver output current, a temperature-independent constant-current gate driver having a consistent current output regardless of the charging drain current of the power transistor. In other examples, not illustrated, input voltage $V_{IN}$ may be kept low during the transition period 1104, or may be controlled to follow a dynamic, time-dependent voltage profile.

During transition period 1104, the booster output voltage $V_{GS}$ ramps up to a plateau voltage during which switching occurs, at least in part. Because of the Miller effect, the gate-source voltage $V_{GS}$ does not change until the drain-source voltage $V_{DS}$ has collapsed. After the plateau voltage, which the booster output voltage $V_{GS}$ continues to ramp up close to the value of the positive rail. Responsive to reaching the value of the positive rail or coming within a threshold of the value of the positive rail, the output current $I_{out}$ decreases, and the booster no longer has the ability to supply the gain current $kI_{in}$. The booster can consider this inability as an end-of-charge or end-of-switching condition. At this point, which marks the beginning of third period 1106, the booster can pull the value of the input voltage $V_{IN}$ high (e.g., to the value of the positive input supply rail) and also pull the value of the output voltage $V_{GS}$ high (e.g., to the value of the positive output supply rail) and hold the output voltage $V_{GS}$ high with a low-impedance circuit. Pulling the input voltage $V_{IN}$ high shuts off booster input current $I_{in}$ from the gate driver, which is dissipative after power transistor turn-on.

The turn-on functioning of the driver-booster arrangement 700 or 800 as depicted in FIG. 11 can be contrasted with the functioning of driver-booster arrangement 400 of FIG. 4. With a voltage-buffer booster such as the NPN/PNP booster 404 of FIG. 4, the input voltage of the booster follows the gate-source voltage of the power transistor exactly. As can be seen by FIG. 11, input voltage of the booster $V_{IN}$ can be precisely controlled, e.g., by output voltage sensing and control circuitry 814, and is not required to exactly follow the booster output voltage $V_{GS}$, which is the gate-source voltage of the power transistor.

The turn-off timing diagram of FIG. 12 is likewise divided into three periods, a first period 1202 in which the switch is on, a second period 1204 in which the switch is transitioning from on to off, and a third period 1206 in which the switch is completely off. At the beginning of first period 1202, the booster output voltage $V_{GS}$ is held high, as it was at the end of third period 1106 of the turn-on example of FIG. 11. Responsive to detecting, at the beginning of second period 1204, a negative input current $I_{in}$ from the gate driver trying to pull the output low, as may be detected using current sensor 806, the booster can set the input voltage $V_{IN}$ to a controlled voltage value. In the illustrated example, this controlled voltage value is an intermediate voltage value at half-rail. As stated above, the controlled voltage value can be constant (as in the illustrated example) or can dynamically follow a time-variant profile.

The output current $T_{out}$ of the booster follows the input current $I_{in}$ as scaled by gain k, and the output current $I_{out}$ discharges the gate capacitance of the power transistor. The gate-source voltage $V_{GS}$ of the power transistor falls, again passing through a plateau voltage. Responsive to the gate-source voltage $V_{GS}$ reaching or coming within a threshold of the lower rail, or responsive to the output current $I_{out}$ dropping below a threshold value, the booster can, at the beginning of third period 1206, pull the output voltage $V_{GS}$ low and hold it low with a low-impedance circuit. In the third periods 1106, 1206 of FIGS. 11 and 12, after the power transistor coupled at the output of the booster is fully switched, regardless of whether the booster output voltage $V_{OUT}$ is high or low, the booster 804 is not in gain mode, but instead holds the power transistor gate high or low to remain fully switched on or fully switched off, without any dissipative switching current coming from a gate driver coupled at the input of the booster.

Figure 13:
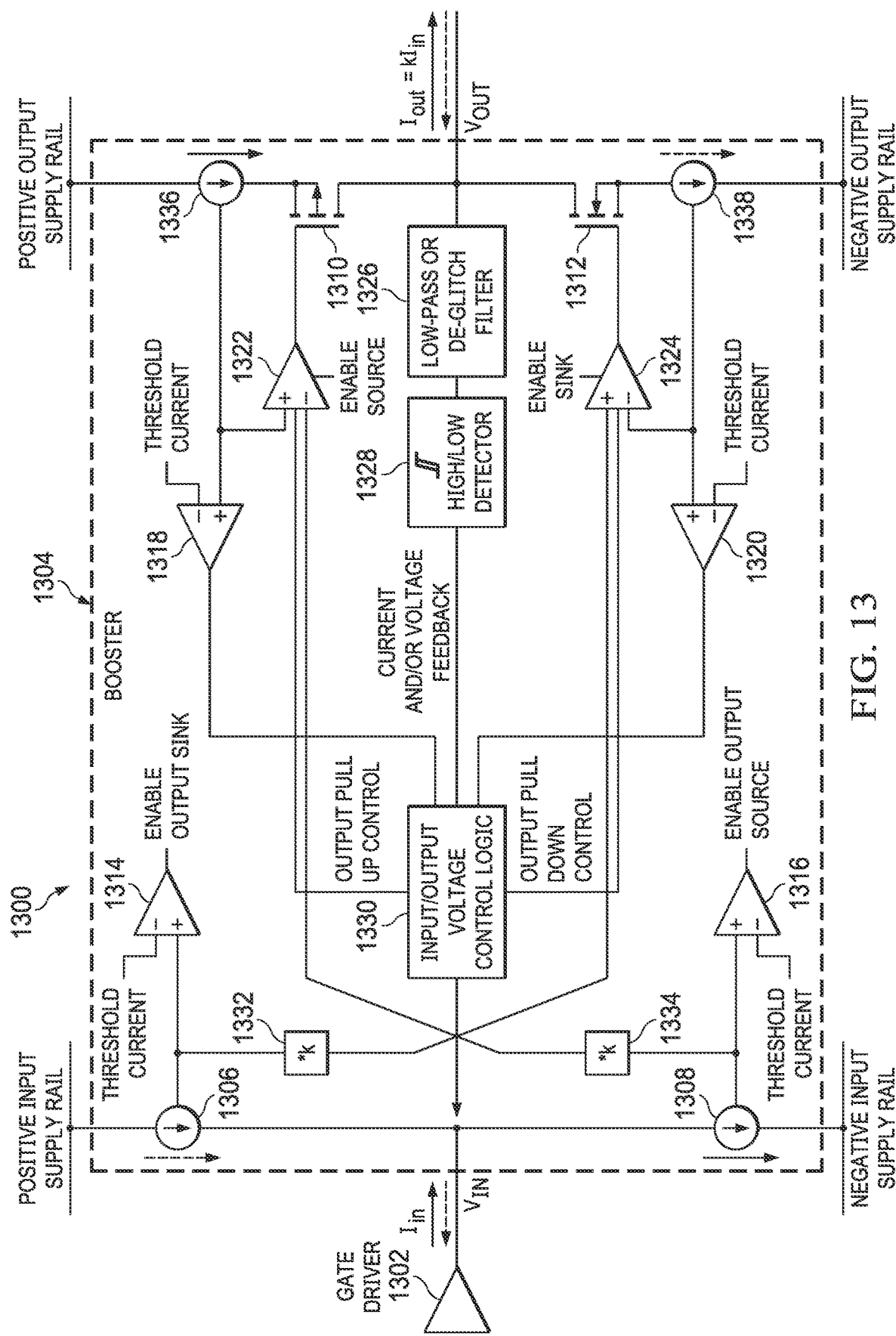
FIG. 13 is a block diagram of an example driver-booster arrangement.

FIG. 13 illustrates an example driver-booster arrangement 1300 having gate driver 1302 and an example fixed current-gain booster with input voltage control 1304, which can be used to implement booster 804 of FIG. 8, booster 704 of FIG. 7, or booster 604 of FIG. 6. Comparators 1314, 1316, 1318, 1320 produce respective logic outputs that are either high or low in value (on/off). A respective enable pin on each of operational amplifiers ("op-amps") 1322, 1324 turns on the respective comparator to make it run in a current-gain mode. When not running in a current-gain mode, each of op-amps 1322, 1324 runs in a hard on/off logic mode according to inputs provided by respective output pull-up or pull-down controls provided by input/output voltage control logic 1330.

In booster 1304, negative input current sensor 1306 and positive input current sensor 1308 can respectively implement current sensors 806, 808, and can function as described above with respect to FIG. 8. When input current $I_{in}$ provided by driver 1302 is directed into booster 1304, positive input current sensor 1308 measures the current flowing from the booster input toward the negative input supply rail, multiplies this current by a constant gain factor k at amplifier 1334, and provides the amplified signal to source control op-amp 1322. Source control op-amp 1322 controls the gate of pull-up transistor 1310 (illustrated as a PFET) to control the flow of booster output current $T_{out}$ from the positive output supply rail to the booster output. When input current $I_{in}$ provided by driver 1302 is directed out of booster 1304, negative input current sensor 1306 measures the current flowing from the positive input supply rail toward the booster input, multiplies this current by a constant gain factor k at amplifier 1332, and provides the amplified signal to sink control op-amp 1324. Sink control op-amp 1324 controls the gate of pull-down transistor 1312 (illustrated as an NFET) to control the flow of booster output current $I_{out}$ from the booster output to the positive output supply rail.

The output voltage $V_{OUT}$ at the booster output is provided to low-pass or de-glitch filter 1326, and subsequently to high/low detector 1328 to provide current and/or voltage feedback to input and output voltage control logic 1330. Input and output voltage control logic 1330 controls the input voltage $V_{IN}$ at the booster input responsive to the provided output voltage feedback and/or current feedback.

Source enable comparator 1316 compares a value of a positive booster input current $I_{in}$ as measured by positive input current sensor 1308 to a threshold current value. If the positive booster input current is greater than the threshold, source enable comparator 1316 enables source control op-amp 1322 to run in a current-gain mode to subtract the instantaneous value of the gain-scaled positive input current from the instantaneous value of the positive output current $I_{out}$ as measured by the positive output current sensor 1336. Source control op-amp 1322 thus controls the gate of pull-up transistor 1310 to vary the sourcing flow of booster output current $I_{out}$ from the positive output supply rail to the booster output responsive to the determined difference. In this way, source enable comparator 1316 informs booster 1304 of the point at which turned-off period 1102 of FIG. 11 has ended and turn-on transition period 1104 of FIG. 11 has begun.

Sink enable comparator 1314 compares a value of a negative booster input current $I_{in}$ as measured by negative input current sensor 1306 to a threshold current value. If the negative booster input current is greater than the threshold, sink enable comparator 1346 enables sink control op-amp 1324 to run in a current-gain mode to subtract the instantaneous value of the negative output current $I_{out}$ as measured by the negative output current sensor 1338 from the instantaneous value of the gain-scaled negative input current. Sink control op-amp 1324 thus controls the gate of pull-down transistor 1312 to vary the sinking flow of booster output current $I_{out}$ from the booster output to the negative output supply rail responsive to the determined difference. In this way, sink enable comparator 1314 informs booster 1304 of the point at which turned-on period 1202 of FIG. 12 has ended and turn-off transition period 1204 of FIG. 12 has begun.

On the output side of booster 1304, source feedback comparator 1318 compares a value of a positive booster output current $I_{out}$ as measured by positive output current sensor 1336 to a threshold current value, and sink feedback comparator 1320 compares a value of a negative booster output current $I_{out}$ as measured by negative output current sensor 1338 to a threshold current value. The respective outputs of these feedback comparators 1318, 1320 can be provided to input/output voltage control logic 1330, which can use the provided feedback to determine a point at which to terminate either the charging (turn-on) or discharging (turn-off) operations, e.g., to end turn-on period 1104 and begin turned-on period 1106 in FIG. 11, or to end turn-off period 1204 and begin turned-off period 1206 in FIG. 12. This determination can be responsive to the current feedback provided by feedback comparators 1318, 1320 and/or on a measurement of output voltage $V_{OUT}$ and comparison of the measured output voltage $V_{OUT}$ to a supply rail voltage value or a near-rail threshold voltage value. For example, input/output voltage control logic 1330 can be configured to determine during turn-on period 1104 that booster output voltage $V_{OUT}$ is at or within a threshold of the positive output supply rail voltage value, and can terminate turn-on by controlling the booster input voltage $V_{IN}$ to voltage value of the positive input supply rail to begin tuned-on period 1106. As another example, input/output voltage control logic 1330 can be configured to determine during turn-off period 1204 that booster output voltage $V_{OUT}$ is at or within a threshold of the negative output supply rail voltage value, and can terminate turn-off by controlling the booster input voltage $V_{IN}$ to voltage value of the negative input supply rail to begin tuned-off period 1206.

The individual threshold current values provided to comparators 1314, 1316, 1318, 1320 can be assigned to each be different, and they can be relatively low current values. The threshold value provided to source enable comparator 1316 can be the value above which the measured positive input current $I_{in}$ is sufficient for the booster 1304 to determine that the gate driver 1302 is attempting to turn on the power switch from an initial off state. As another example, the threshold value provided to sink enable comparator 1314 can be the value above which the measured negative input current $I_{in}$ is sufficient for the booster 1304 to determine that the gate driver 1302 is attempting to turn off the power switch from an initial on state. As still another example, the threshold value provided to source feedback comparator 1318 can be the value below which the measured output current $I_{out}$ is determined to be so low that the end of turn-on period 1104 has been reached and can be terminated to start turned-on period 1106. As yet another example, the threshold value provided to sink feedback comparator 1320 can be the value below which the measured output current $I_{out}$ is determined to be so low that the end of turn-off period 1204 has been reached and can be terminated to start turned-off period 1206.

Initially during turned-off period 1102 of FIG. 11, sink control op-amp 1324 is controlled by the input/output voltage control logic 1330 to turn on pull-down transistor 1312 to pull down on the booster output, keeping the booster output voltage $V_{OUT}$ at the voltage value of the negative output supply rail. Responsive to source enable comparator 1316 detecting, responsive to a comparison of a measurement provided by positive input current sensor 1308 with a threshold, the start the turn-on operation, the enable source input of source control op-amp 1322 activates the current-gain mode of source control op-amp 1322, controlling pull-up transistor 1310, and the booster 1304 subsequently operates in gain mode, beginning turn-on period 1104 of FIG. 11.

During this turn-on period 1104, the positive booster output current $I_{out}$ is a scaled copy of the positive booster input current $I_{in}$. Also during this turn-on period 1104, input/output voltage control logic 1330 controls the booster input voltage $V_{IN}$ either to a constant (e.g., intermediate, e.g., mid-rail) voltage value, or to a time-variant voltage value, as described above. During this turn-on period 1104, as the gate capacitance of the power transistor coupled to the output of the booster 1304 charges, the output voltage $V_{OUT}$ increases until booster 1304 is no longer able to provide the output current $I_{out}$ as $kI_{in}$. Responsive to either or both of the booster output voltage $V_{OUT}$ reaching or coming within a threshold of the positive output supply rail or the positive booster output current $I_{out}$ (as measured by positive output current sensor 1336) falling below a threshold (as determined by source feedback comparator 1318), source control op-amp 1322 changes operation to no longer run in current-gain mode. Source control op-amp 1322 turns the gate of pull-up transistor 1310 hard on and pulls the booster output voltage $V_{OUT}$ to the value of the positive output supply rail. At this point, turn-on period 1104 has ended and turned-on period 1106 has begun.

Initially during turned-on period 1202 of FIG. 12, source control op-amp 1322 is controlled by the input/output voltage control logic 1330 to turn on pull-up transistor 1310 to pull up on the booster output, keeping the booster output voltage $V_{OUT}$ at the voltage value of the positive output supply rail. Responsive to source enable comparator 1314 detecting, responsive to a comparison of a measurement provided by negative input current sensor 1306 with a threshold, the start the turn-off operation, the enable sink input of sink control op-amp 1324 activates the current-gain mode of sink control op-amp 1324, controlling pull-down transistor 1312, and the booster 1304 subsequently operates in gain mode, beginning turn-off period 1204 of FIG. 12.

During this turn-off period 1204, the negative booster output current $I_{out}$ is a scaled copy of the negative booster input current $I_{in}$. Also during this turn-off period 1204, input/output voltage control logic 1330 controls the booster input voltage $V_{IN}$ either to a constant (e.g., intermediate, e.g., mid-rail) voltage value, or to a time-variant voltage value, as described above. During this turn-off period 1204, as the gate capacitance of the power transistor coupled to the output of the booster 1304 discharges, the output voltage $V_{OUT}$ decreases until booster 1304 is no longer able to provide the output current $I_{out}$ as $kI_{in}$. Responsive to either or both of the booster output voltage $V_{OUT}$ reaching or coming within a threshold of the negative output supply rail or the negative booster output current $I_{out}$ (as measured by negative output current sensor 1338) falling below a threshold (as determined by sink feedback comparator 1320), sink control op-amp 1324 changes operation to no longer run in current-gain mode. Sink control op-amp 1324 turns the gate of pull-down transistor 1312 hard on and pulls the booster output voltage $V_{OUT}$ to the value of the negative output supply rail. At this point, turn-off period 1204 has ended and turned-off period 1206 has begun.

Low-pass or de-glitch filter 1326 and high-low detector 1328 both assist in reducing false-positive reports, to input/out voltage control logic 1330, of turn-on or turn-off period termination, as measured by output voltage $V_{OUT}$. Low-pass or de-glitch filter 1326 can be implemented with either analog or digital circuitry and is configured to prevent an initial transient spike in output voltage $V_{OUT}$, as may be caused by parasitic inductances, from triggering termination of turn-on period 1104. A low-pass filter smooths out transients by filtering out high frequencies. By comparison, a de-glitch filter compares a voltage signal with a delayed version of the same voltage signal. High-low detector 1328 reduces false-positive period termination detection by informing input/output voltage control logic 1330 of a super-threshold high output voltage value only under the circumstances that the booster 1304 is in a turn-on period 1104, and by informing input/output voltage control logic 1330 of a subthreshold low output voltage value only under the circumstances that the booster 1304 is in a turn-off period 1204.

Input/output voltage control logic 1330 is illustrated in FIG. 13 as having three inputs and three outputs. Two inputs to input/output voltage control logic 1330 come from the outputs of source and sink feedback comparators 1318, 1320 and provide information about the state of the output current $I_{out}$, e.g., whether output current $I_{out}$ has fallen below a low threshold. A third input to input/output voltage control logic 1330 is responsive to the output voltage $V_{OUT}$ as processed to temper for false-positives by low-pass or de-glitch filter 1326 and high/low detector 1328. In some examples of booster 1304, the enable output source signal provided by the source enable comparator 1316 and the enable output sink signal provided by the sink enable comparator 1314 can be provided as inputs to the input/output voltage control logic 1330, which in turn can provide the enable source and enable sink signals to the respective source and sink control op-amps 1322, 1324. In other examples of booster 1304, the enable output source signal can be provided directly as the enable source signal to the source control op-amp 1322 and the enable output sink signal can be provided directly as the enable sink signal to the sink control op-amp 1324. Input/output voltage control logic 1330 can comprise digital logic circuitry to process its inputs to determine (a) the point at which a turned-off period 1206/1102 has ended and a turn-on period 1104 can be induced to begin, (b) the point at which a turn-on period 1104 has ended and a turned-on period 1106/1202 can be induced to begin, (c) the point at which a turned-on period 1106/1202 has ended and a turn-off period 1204 can be induced to begin, and (d) the point at which a turn-off period 1204 has ended and a turned-off period 1206/1102 can be induced to begin.

Two outputs from input/output voltage control logic 1330, labeled in FIG. 13 as output pull up control and output pull-down control, are provided to respective source and sink control op-amps 1322, 1324 to inform op-amps 1322, 1324 that a turned-on period 1106/1502 has been entered, and thus that booster output voltage $V_{OUT}$ can be pulled up to the value of the positive output supply rail, or that a turned-off period 1206/1102 has been entered, and thus that booster output voltage $V_{OUT}$ can be pulled down to the value of the negative output supply rail. A third output from input/out voltage control logic controls the value of the booster input voltage $V_{IN}$, either to a constant voltage or according to a time-variant voltage profile, as described above.

Figure 14:
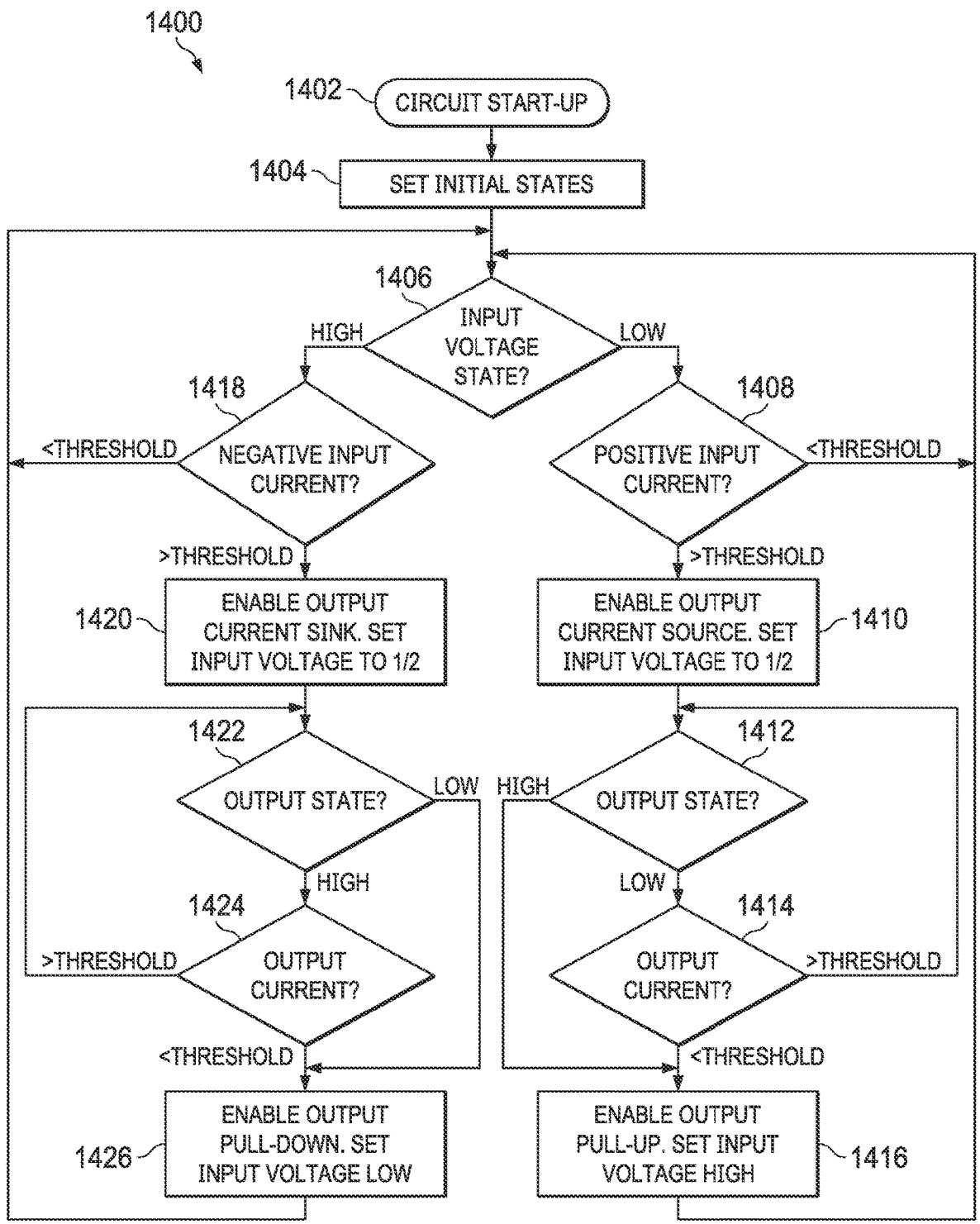
FIG. 14 is a flow diagram of an example method of fixed current-gain boosting for a capacitive gate power device with input voltage control.

FIG. 14 is a flow chart of a method 1400 of an example fixed current-gain booster control that details example logical functioning of the output voltage sensing and control 814 or the input/output voltage control logic 1330, and thus the functioning of the booster 704, 804, or 1304 generally. Responsive to circuit startup 1402, initial logic states may be set 1404 within control logic, e.g., control logic 1330 in FIG. 13. In examples designed to have the power switch coupled to the output of the booster providing no power at start-up, the output pull down control can be set to a high value and the output pull up control can be set to a low value so the power switch coupled to the output of the booster is initially set to a switched-off state. In examples designed to have the power switch coupled to the output of the booster provide power at startup, the output pull up control can be set to a high value and the output pull down control can be set to a low value so the power switch coupled to the output of the booster is initially set to a switched-on state. The input voltage can be controlled to a high or low voltage accordingly. The enable signals of op-amps 1322, 1324 can be set accordingly. The various threshold currents may be initialized to programmed or default values.

The input voltage state (high or low) is determined 1406. Responsive to determining 1406 the input voltage state to be low, a loop on the right side of FIG. 14 is entered into. Within this loop, it is determined 1408 whether a positive input current to the booster exceeds a threshold. In the example arrangement 1300 of FIG. 13, this determination 1408 can be made by source enable comparator 1316. If the positive input current does not exceed the threshold, the input voltage state is again checked 1406. Responsive to the positive input current exceeding the threshold, the output current source is enabled 1410. In the example of FIG. 13, this entails activation of the current-gain mode of source control op-amp 1322 to control the gate of pull-up transistor 1310. Also responsive to the positive input current exceeding the threshold, the booster input voltage can be controlled 1410 to a value, e.g., an intermediate value that is mid-way between the positive and negative input supply rails, or in accordance with a time-variant voltage profile. This controlling 1410 of the booster input voltage can be done, in the example of FIG. 8, by output voltage sensing and control circuitry 814, or in the example of FIG. 13, by input/output voltage control logic 1330.

Subsequently, the booster output voltage is measured 1412 to determine whether it is yet high or still low. As shown in FIG. 11, the booster output voltage can be expected to progressively go from low to high during the switch-on transition 1104. In the example of FIG. 13, this determination can be made by low-pass or de-glitch filter 1326 and high/low detector 1328. If the booster output voltage is still low (e.g., less than a threshold), the booster output current is measured and compared to a threshold 1414. If the booster output current is above the threshold, then it is unlikely that the charging of the gate capacitance of the power transistor coupled to the output of the booster has completed, and the method 1400 returns to measuring the booster output voltage 1412. If, however, the output current is determined to be less than the threshold, or if the output voltage is determined 1412 to be high (e.g., greater than a threshold), then it is likely that the power transistor is close to being fully switched on. The output pull-up is enabled 1416, e.g., by input/output voltage control logic 1330 bringing the output pull up control signal high, and the booster input voltage is set to high 1416, e.g., by input/output voltage control logic 1330 controlling the booster input voltage $V_{IN}$ to be the value of the positive input supply rail. The switched-on state has been reached and the input voltage state is high. The method 1400 returns to testing the input voltage state 1406, which, at this point, will lead to the left-side loop of FIG. 14.

Responsive to determining 1406 the input voltage state to be high, a loop on the left side of FIG. 14 is entered into. Within this loop, it is determined 1418 whether a negative input current to the booster exceeds a threshold. In the example arrangement 1300 of FIG. 13, this determination 1418 can be made by sink enable comparator 1314. If the negative input current does not exceed the threshold, the input voltage state is again checked 1406. Responsive to the negative input current exceeding the threshold, the output current sink is enabled 1420. In the example of FIG. 13, this entails activation of the current-gain mode of sink control op-amp 1324 to control the gate of pull-down transistor 1312. Also responsive to the negative input current exceeding the threshold, the booster input voltage can be controlled 1420 to a value, e.g., an intermediate value that is mid-way between the positive and negative input supply rails, or in accordance with a time-variant voltage profile. This controlling 1420 of the booster input voltage can be done, in the example of FIG. 8, by output voltage sensing and control circuitry 814, or in the example of FIG. 13, by input/output voltage control logic 1330.

Subsequently, the booster output voltage is measured 1422 to determine whether it is yet low or still high. In the example of FIG. 13, this determination can be made by low-pass or de-glitch filter 1326 and high/low detector 1328. As shown in FIG. 12, the booster output voltage can be expected to progressively go from high to low during the switch-off transition 1204. If the booster output voltage is still high (e.g., greater than a threshold), the booster output current is measured and compared to a threshold 1424. If the booster output current is above the threshold, then it is unlikely that the discharging of the gate capacitance of the power transistor coupled to the output of the booster has completed, and the method 1400 returns to measuring the booster output voltage 1422. If, however, the output current is determined to be less than the threshold, or if the output voltage is determined 1422 to be low (e.g., less than a threshold), then it is likely that the power transistor is close to being fully switched off. The output pull-down is enabled 1426, e.g., by input/output voltage control logic 1330 bringing the output pull down control signal high, and the booster input voltage is set to low 1426, e.g., by input/output voltage control logic 1330 controlling the booster input voltage $V_{IN}$ to be the value of the negative input supply rail. The switched-off state has been reached and the input voltage state is low. The method 1400 returns to testing the input voltage state 1406, which, at this point, will lead to the right-side loop of FIG. 14.

Method 1400 alternates between left-side and right-side loops to turn on and off the power switch coupled to the output of the booster. In some examples, output voltage sensing and control 814 and/or input/out voltage control logic 1330 can be configured to follow method 1400 during normal operation states. Output voltage sensing and control 814 and/or input/out voltage control logic 1330 can be configured to follow alternative procedures in fault and protection states. Fault or protection states may be entered, for example, if it is detected that the booster output is a short circuit, if it is detected that the gate of the power transistor is broken and the power transistor does not turn on or does not turn off, if a persistent input current is detected irrespective of operating conditions that would otherwise indicate a cessation of input current, or if another fault condition is detected.

Gate drive booster circuits and methods as described herein are compatible with different types of gate drivers conventional and smart voltage-driven and current-driven. Devices and methods as described herein provide enhanced performance of conventional gate drivers and provide increased common mode input voltage range operation and thus increase ground bounce immunity through control of booster input terminal voltage. Devices and methods as described herein remove the need for an external current limiting resistor. The use of a low- and fixed-current-gain amplifier as a booster maintains the characteristics of the preceding stage's driver, such as the time-variance and the drive-strength-variance of the gate driver output current, and the resultant booster output current is directly determined by the preceding stage's driver, rather than by the booster circuit. Accordingly, additional components, such as current-limiting resistors, are unnecessary.

Booster 704, 804, or 1304 provides a buffer/amplifier circuit that works not only with the resistor-based, voltage-driven gate drive 100 of FIG. 1, but it also works with a constant-current gate drive 200 of FIG. 2 while still providing a current gain, which the discrete booster implementation 404 or 504 in FIG. 4 or 5 does not do. Moreover, booster 704, 804, or 1304 provides a buffer/amplifier circuit that works driven by a smart gate driver, like smart driver 302 of FIG. 3, where the provided current may be controlled by a feedback loop and can time-variant according to a current profile set by the gate driver and intended be duplicated at the booster output. Boosters as described herein can be placed in close spatial proximity to respective power transistors, minimizing gate inductance and improving switching performance.

In this description, the term "responsive to" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or IC package) and may be configured to couple to at least some of the passive elements and/or the sources to form the described structure either at a time of manufacture or after a time of manufacture, such as by an end-user and/or a third-party.

Modifications are possible in the described embodiments, and other embodiments are possible, within the scope of the claims.

What is claimed is:

1. A circuit comprising:
    a negative input current sensor having first and second negative input current sensing inputs and a negative input current measurement output, the first negative input current sensing input coupled to a first input supply terminal, and the second negative input current sensing input configured to receive a negative input current;
    a positive input current sensor having first and second positive input current sensing inputs and a positive input current measurement output, the first positive input current sensing input configured to receive a positive input current, and the second positive input current sensing input coupled to a second input supply terminal;

a pull-up controlled current source having a pull-up input and first and second pull-up outputs, the first pull-up output coupled to a first output supply terminal, the second pull-up output configured to provide a positive output current, and the pull-up input coupled to the positive input current measurement output;

a pull-down controlled current source having a pull-down input and first and second pull-down outputs, the first pull-down output configured to provide a negative output current, the second pull-down output coupled to a second output supply terminal, and the pull-down input coupled to the negative input current measurement output; and output voltage sensing and control circuitry having a voltage-sensing input and a voltage-control output, the voltage-sensing input coupled to the second pull-up output, and the voltage-control output coupled to the second negative input current sensing input.

2. The circuit of claim 1, wherein:

the pull-up controlled current source is configured to provide the positive output current as a gain-scaled copy of the positive input current as measured by the positive input current sensor; and the pull-down controlled current source is configured to provide the negative output current as a gain-scaled copy of the negative input current as measured by the negative input current sensor.

3. The circuit of claim 1, wherein the output voltage sensing and control circuitry comprises:

a low-pass filter or de-glitch filter having an input and an output, the input coupled to the second pull-up output;

a high/low detector having an input and an output, the input coupled to the output of the low-pass filter or de-glitch filter; and input/output voltage control logic having an input and an output, the input coupled to the output of the high/low detector, and the output coupled to the second negative input current sensing input.

4. The circuit of claim 1, wherein the output voltage sensing and control circuitry is configured to control a voltage at the voltage-control output to a constant value, or according to a time-variant voltage profile, for a duration of a switch-on or switch-off period responsive to the circuit detecting a change in the positive or negative input current.

5. The circuit of claim 1, further comprising:

a positive output current sensor having first and second positive output current sensing inputs and a positive output current measurement output, the first positive output current sensing input coupled to the first output supply terminal;

a negative output current sensor having first and second negative output current sensing inputs and a negative output current measurement output, the second negative output current sensing input coupled to the second output supply terminal;

wherein the pull-up controlled current source comprises:

a first amplifying circuit having a first amplifying input and a first amplifying output, the first amplifying input coupled to the positive input current measurement output, and the first amplifying circuit configured to scale the positive input current measured by the positive input current sensor by a gain value;

a pull-up transistor having a pull-up gate, a pull-up source and a pull-up drain, the pull-up source coupled to the second positive output current sensing input, and the pull-up drain coupled to the voltage-sensing input; and a source control operational amplifier having first and second source control differential inputs and a source control output, the first source control differential input coupled to the positive output current measurement output, the second source control differential input coupled to the first amplifying output, and the source control output coupled to the pull-up gate; and wherein the pull-down controlled current source comprises:

a second amplifying circuit having a second amplifying input and a second amplifying output, the second amplifying input coupled to the negative input current measurement output, and the second amplifying circuit configured to scale the negative input current measured by the negative input current sensor by the gain value;

a pull-down transistor having a pull-down gate, a pull-down source and a pull-down drain, the pull-down drain coupled to the voltage-sensing input, and the pull-down source coupled to the first negative output current sensing input; and a sink control operational amplifier having first and second sink control differential inputs and a sink control output, the first sink control differential input coupled to the second amplifying output, the second sink control differential input coupled to the negative output current measurement output, and the sink control output coupled to the pull-down gate.

6. The circuit of claim 5, further comprising:

a sink enable comparator having first and second sink enable differential inputs and a sink enable output, the first differential sink enable input coupled to the negative input current measurement output, the second sink enable differential input coupled to a first threshold, and the sink enable output coupled to an enable output sink input of the output voltage sensing and control circuitry or to an enable sink input of the sink control operational amplifier; and a source enable comparator having first and second source enable differential inputs and a source enable output, the first differential source enable input coupled to the positive input current measurement output, the second source enable differential input coupled to a second threshold, and the source enable output coupled to an enable output source input of the output voltage sensing and control circuitry or to an enable source input of the source control operational amplifier.

7. The circuit of claim 6, further comprising:

a source feedback comparator having first and second source feedback differential inputs and a source feedback output, the first source feedback differential input coupled to the positive output current measurement output, the second source feedback differential input coupled to a third threshold, and the source feedback output coupled to a source current feedback input of the output voltage sensing and control circuitry; and a sink feedback comparator having first and second sink feedback differential inputs and a sink feedback output, the first sink feedback differential input coupled to the negative output current measurement output, the second sink feedback differential input coupled to a fourth threshold, and the sink feedback output coupled to a sink current feedback input of the output voltage sensing and control circuitry.

8. The circuit of claim 1, wherein the output voltage sensing and control circuitry is configured to:

determine that an input voltage at the voltage-control output is less than an input voltage threshold;
determine that the positive input current is greater than a positive input current threshold;
enable the pull-up controlled current source to provide a gain-scaled copy of the positive input current as the positive output current; and
control the input voltage to a first constant value or according to a first time-variant voltage profile.

9. The circuit of claim 8, wherein the output voltage sensing and control circuitry is configured to:
determine that an output voltage at the voltage-sensing input is greater than a first output threshold voltage, or that the positive output current is less than a positive output current threshold;
enable the pull-up controlled current source to pull and hold the output voltage to a voltage value of the first output supply terminal; and
control the input voltage to a voltage value of the first input supply terminal.

10. The circuit of claim 9, wherein the output voltage sensing and control circuitry is configured to:
determine that the input voltage is greater than the input voltage threshold;
determine that the negative input current is greater than a negative input current threshold;
enable the pull-down controlled current source to provide a gain-scaled copy of the negative input current as the negative output current; and
control the input voltage to a second constant value or according to a second time-variant voltage profile, where the second constant value can be the same as or different from the first constant value.

11. The circuit of claim 10, wherein the output voltage sensing and control circuitry is configured to:
determine that the output voltage is less than a second output threshold voltage, or that the negative output current is less than a negative output current threshold;
enable the pull-down controlled current source to pull and hold the output voltage to a voltage value of the second output supply terminal; and
control the input voltage to a voltage value of the second input supply terminal.

* * * * *